(12) United States Patent
Lee et al.

(10) Patent No.: US 7,732,327 B2
(45) Date of Patent: Jun. 8, 2010

(54) VAPOR DEPOSITION OF TUNGSTEN MATERIALS

(75) Inventors: Sang-Hyeob Lee, Fremont, CA (US);
Avgerinos V. Gelatos, Redwood City, CA (US); Kai Wu, Palo Alto, CA (US); Amit Khandelwal, Santa Clara, CA (US); Ross Marshall, Sunnyvale, CA (US); Emily Renuart, Santa Clara, CA (US); Wing-Cheong Gilbert Lai, Santa Clara, CA (US); Jing Lin, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 61 days.

(21) Appl. No.: 12/239,046

(22) Filed: Sep. 26, 2008

(65) Prior Publication Data

US 2009/0081866 A1    Mar. 26, 2009

Related U.S. Application Data

(63) Continuation-in-part of application No. 12/121,209, filed on May 15, 2008, and a continuation-in-part of
(Continued)

(60) Provisional application No. 60/976,120, filed on Sep. 28, 2007, provisional application No. 60/938,124, filed on May 15, 2007, provisional application No. 60/328,451, filed on Oct. 10, 2001, provisional application No. 60/305,765, filed on Jul. 16, 2001.

(51) Int. Cl.
*H01L 21/4763* (2006.01)

(52) U.S. Cl. ............... 438/649; 438/683; 427/255.392; 257/E21.165

(58) Field of Classification Search ............ 438/630, 438/649, 655, 683; 257/E21.165, E21.2; 427/255.392
See application file for complete search history.

(56) References Cited

U.S. PATENT DOCUMENTS 4,058,430 A    11/1977    Suntola et al.

(Continued)

FOREIGN PATENT DOCUMENTS

DE    19627017    1/1997

(Continued)

OTHER PUBLICATIONS

Ashtiani, et al. "Pulsed Nucleation Layer of Tungsten Nitride Barrier Film and its Application in DRAM and Logic Manufacturing," SEMI Technical Symposium: Innovations in Semiconductor Manufacturing (STS: ISM), SEMICON Korea 2006, Semiconductor Equipment and Materials International, pp. 1-6.

(Continued)

*Primary Examiner*—Thanhha Pham
(74) *Attorney, Agent, or Firm*—Patterson & Sheridan

(57) ABSTRACT

Embodiments of the invention provide an improved process for depositing tungsten-containing materials. The process utilizes soak processes and vapor deposition processes to provide tungsten films having significantly improved surface uniformity while increasing the production level throughput. In one embodiment, a method is provided which includes depositing a tungsten silicide layer on the substrate by exposing the substrate to a continuous flow of a silicon precursor while also exposing the substrate to intermittent pulses of a tungsten precursor. The method further provides that the substrate is exposed to the silicon and tungsten precursors which have a silicon/tungsten precursor flow rate ratio of greater than 1, for example, about 2, about 3, or greater. Subsequently, the method provides depositing a tungsten nitride layer on the tungsten suicide layer, depositing a tungsten nucleation layer on the tungsten nitride layer, and depositing a tungsten bulk layer on the tungsten nucleation layer.

25 Claims, 6 Drawing Sheets

Related U.S. Application Data application No. 11/038,592, filed on Jan. 19, 2005, now Pat. No. 7,405,158, which is a continuation-in-part of application No. 10/418,728, filed on Apr. 18, 2003, now abandoned, which is a continuation-in-part of application No. 10/268,195, filed on Oct. 10, 2002, now Pat. No. 6,797,340, said application No. 11/038,592 is a continuation-in-part of application No. 10/879,448, filed on Jun. 29, 2004, now abandoned, which is a continuation of application No. 10/268,195, filed on Oct. 10, 2002, now Pat. No. 6,797,340, said application No. 11/038,592 is a continuation-in-part of application No. 10/762,764, filed on Jan. 22, 2004, now abandoned, which is a continuation of application No. 09/678,266, filed on Oct. 3, 2000, now Pat. No. 7,101,795, which is a continuation-in-part of application No. 09/605,593, filed on Jun. 28, 2000, now Pat. No. 6,551,929, said application No. 11/038,592 is a continuation-in-part of application No. 10/196,514, filed on Jul. 15, 2002, now Pat. No. 6,936,538.

(56) References Cited

U.S. PATENT DOCUMENTS

| | | |
|---|---|---|
| 4,389,973 A | 6/1983 | Suntola et al. |
| 4,413,022 A | 11/1983 | Suntola et al. |
| 4,486,487 A | 12/1984 | Skarp et al. |
| 4,767,494 A | 8/1988 | Kobayashi et al. |
| 4,806,321 A | 2/1989 | Nishizawa et al. |
| 4,813,846 A | 3/1989 | Helms et al. |
| 4,829,022 A | 5/1989 | Kobayashi et al. |
| 4,834,831 A | 5/1989 | Nishizawa et al. |
| 4,838,983 A | 6/1989 | Schumaker et al. |
| 4,838,993 A | 6/1989 | Aoki et al. |
| 4,840,921 A | 6/1989 | Matsumoto et al. |
| 4,845,049 A | 7/1989 | Sunakawa et al. |
| 4,859,625 A | 8/1989 | Matsumoto et al. |
| 4,859,627 A | 8/1989 | Sunakawa et al. |
| 4,861,417 A | 8/1989 | Mochizuki et al. |
| 4,876,218 A | 10/1989 | Pessa et al. |
| 4,892,751 A | 1/1990 | Miyake et al. |
| 4,917,556 A | 4/1990 | Stark et al. |
| 4,927,670 A | 5/1990 | Erbil |
| 4,931,132 A | 6/1990 | Aspnes et al. |
| 4,951,601 A | 8/1990 | Maydan et al. |
| 4,960,720 A | 10/1990 | Shimbo et al. |
| 4,975,252 A | 12/1990 | Nishizawa et al. |
| 4,976,839 A | 12/1990 | Inoue et al. |
| 4,993,357 A | 2/1991 | Scholz et al. |
| 5,000,113 A | 3/1991 | Wang et al. |
| 5,013,683 A | 5/1991 | Petroff et al. |
| 5,028,565 A | 7/1991 | Chang et al. |
| 5,082,798 A | 1/1992 | Arimoto et al. |
| 5,085,885 A | 2/1992 | Foley et al. |
| 5,091,320 A | 2/1992 | Aspnes et al. |
| 5,130,269 A | 7/1992 | Kitahara et al. |
| 5,166,092 A | 11/1992 | Mochizuki et al. |
| 5,173,474 A | 12/1992 | Connell et al. |
| 5,186,718 A | 2/1993 | Tepman et al. |
| 5,205,077 A | 4/1993 | Wittstock et al. |
| 5,225,366 A | 7/1993 | Yoder |
| 5,227,335 A | 7/1993 | Holschwandner et al. |
| 5,234,561 A | 8/1993 | Randhawa et al. |
| 5,246,536 A | 9/1993 | Nishizawa et al. |
| 5,250,148 A | 10/1993 | Nishizawa et al. |
| 5,254,207 A | 10/1993 | Nishizawa et al. |
| 5,256,244 A | 10/1993 | Ackerman |
| 5,259,881 A | 11/1993 | Edwards et al. |
| 5,270,247 A | 12/1993 | Sakuma et al. |
| 5,278,435 A | 1/1994 | Van Hove et al. |
| 5,281,274 A | 1/1994 | Yoder |
| 5,286,296 A | 2/1994 | Sato et al. |
| 5,290,748 A | 3/1994 | Knuuttila et al. |
| 5,294,286 A | 3/1994 | Nishizawa et al. |
| 5,296,403 A | 3/1994 | Nishizawa et al. |
| 5,300,186 A | 4/1994 | Kitahara et al. |
| 5,306,666 A | 4/1994 | Izumi et al. |
| 5,311,055 A | 5/1994 | Goodman et al. |
| 5,316,615 A | 5/1994 | Copel et al. |
| 5,316,793 A | 5/1994 | Wallace et al. |
| 5,330,610 A | 7/1994 | Eres et al. |
| 5,336,324 A | 8/1994 | Stall et al. |
| 5,338,389 A | 8/1994 | Nishizawa et al. |
| 5,348,911 A | 9/1994 | Jurgensen et al. |
| 5,374,570 A | 12/1994 | Nasu et al. |
| 5,395,791 A | 3/1995 | Cheng et al. |
| 5,438,952 A | 8/1995 | Otsuka et al. |
| 5,439,876 A | 8/1995 | Graf et al. |
| 5,441,703 A | 8/1995 | Jurgensen et al. |
| 5,443,033 A | 8/1995 | Nishizawa et al. |
| 5,443,647 A | 8/1995 | Aucoin et al. |
| 5,455,072 A | 10/1995 | Bension et al. |
| 5,458,084 A | 10/1995 | Thorne et al. |
| 5,469,806 A | 11/1995 | Mochizuki et al. |
| 5,480,818 A | 1/1996 | Matsumoto et al. |
| 5,483,919 A | 1/1996 | Yokoyama et al. |
| 5,484,664 A | 1/1996 | Kitahara et al. |
| 5,503,875 A | 4/1996 | Imai et al. |
| 5,521,126 A | 5/1996 | Okamura et al. |
| 5,527,733 A | 6/1996 | Nishizawa et al. |
| 5,532,511 A | 7/1996 | Nishizawa et al. |
| 5,540,783 A | 7/1996 | Eres et al. |
| 5,580,380 A | 12/1996 | Liu et al. |
| 5,601,651 A | 2/1997 | Watabe et al. |
| 5,609,689 A | 3/1997 | Kato et al. |
| 5,616,181 A | 4/1997 | Yamamoto et al. |
| 5,637,530 A | 6/1997 | Gaines et al. |
| 5,641,984 A | 6/1997 | Aftergut et al. |
| 5,644,128 A | 7/1997 | Wollnik et al. |
| 5,667,592 A | 9/1997 | Boitnott et al. |
| 5,674,786 A | 10/1997 | Turner et al. |
| 5,693,139 A | 12/1997 | Nishizawa et al. |
| 5,695,564 A | 12/1997 | Imahashi et al. |
| 5,705,224 A | 1/1998 | Murota et al. |
| 5,707,880 A | 1/1998 | Aftergut et al. |
| 5,711,811 A | 1/1998 | Suntola et al. |
| 5,730,801 A | 3/1998 | Tepman et al. |
| 5,730,802 A | 3/1998 | Ishizumi et al. |
| 5,747,113 A | 5/1998 | Tsai |
| 5,749,974 A | 5/1998 | Habuka et al. |
| 5,788,447 A | 8/1998 | Yonemitsu et al. |
| 5,788,799 A | 8/1998 | Steger et al. |
| 5,796,116 A | 8/1998 | Nakata et al. |
| 5,801,634 A | 9/1998 | Young et al. |
| 5,804,488 A | 9/1998 | Shih et al. |
| 5,807,792 A | 9/1998 | Ilg et al. |
| 5,830,270 A | 11/1998 | McKee et al. |
| 5,834,372 A | 11/1998 | Lee et al. |
| 5,835,677 A | 11/1998 | Li et al. |
| 5,851,849 A | 12/1998 | Comizzoli et al. |
| 5,855,675 A | 1/1999 | Doering et al. |
| 5,855,680 A | 1/1999 | Soininen et al. |
| 5,856,219 A | 1/1999 | Naito et al. |
| 5,858,102 A | 1/1999 | Tsai |
| 5,866,213 A | 2/1999 | Foster et al. |
| 5,866,795 A | 2/1999 | Wang et al. |
| 5,879,459 A | 3/1999 | Gadgil et al. |
| 5,882,165 A | 3/1999 | Maydan et al. |
| 5,882,413 A | 3/1999 | Beaulieu et al. |
| 5,904,565 A | 5/1999 | Nguyen et al. |
| 5,916,365 A | 6/1999 | Sherman |
| 5,923,056 A | 7/1999 | Lee et al. |
| 5,923,985 A | 7/1999 | Aoki et al. |

| Patent No. | Date | Inventor |
|---|---|---|
| 5,925,574 A | 7/1999 | Aoki et al. |
| 5,928,389 A | 7/1999 | Jevtic |
| 5,942,040 A | 8/1999 | Kim et al. |
| 5,947,710 A | 9/1999 | Cooper et al. |
| 5,972,430 A | 10/1999 | DiMeo, Jr. et al. |
| 5,989,345 A | 11/1999 | Hatano et al. |
| 6,001,669 A | 12/1999 | Gaines et al. |
| 6,015,590 A | 1/2000 | Suntola et al. |
| 6,025,627 A | 2/2000 | Forbes et al. |
| 6,036,773 A | 3/2000 | Wang et al. |
| 6,042,652 A | 3/2000 | Hyun et al. |
| 6,043,177 A | 3/2000 | Falconer et al. |
| 6,051,286 A | 4/2000 | Zhao et al. |
| 6,062,798 A | 5/2000 | Muka |
| 6,071,808 A | 6/2000 | Merchant et al. |
| 6,084,302 A | 7/2000 | Sandhu |
| 6,086,677 A | 7/2000 | Umotoy et al. |
| 6,099,904 A | 8/2000 | Mak et al. |
| 6,110,556 A | 8/2000 | Bang et al. |
| 6,113,771 A | 9/2000 | Landau et al. |
| 6,113,977 A | 9/2000 | Soininen et al. |
| 6,117,244 A | 9/2000 | Bang et al. |
| 6,124,158 A | 9/2000 | Dautartas et al. |
| 6,130,147 A | 10/2000 | Major et al. |
| 6,139,700 A | 10/2000 | Kang et al. |
| 6,140,237 A | 10/2000 | Chan et al. |
| 6,140,238 A | 10/2000 | Kitch |
| 6,143,659 A | 11/2000 | Leem et al. |
| 6,144,060 A | 11/2000 | Park et al. |
| 6,156,382 A | 12/2000 | Rajagopalan et al. |
| 6,158,446 A | 12/2000 | Mohindra et al. |
| 6,162,715 A | 12/2000 | Mak et al. |
| 6,174,377 B1 | 1/2001 | Doering et al. |
| 6,174,809 B1 | 1/2001 | Kang et al. |
| 6,174,812 B1 | 1/2001 | Hsiung et al. |
| 6,194,310 B1 | 2/2001 | Hsu et al. |
| 6,197,683 B1 | 3/2001 | Kang et al. |
| 6,200,893 B1 | 3/2001 | Sneh |
| 6,203,613 B1 | 3/2001 | Gates et al. |
| 6,206,967 B1 | 3/2001 | Mak et al. |
| 6,207,302 B1 | 3/2001 | Sugiura et al. |
| 6,207,487 B1 | 3/2001 | Kim et al. |
| 6,218,298 B1 | 4/2001 | Hoinkis |
| 6,245,192 B1 | 6/2001 | Dhindsa et al. |
| 6,245,654 B1 | 6/2001 | Shih et al. |
| 6,248,605 B1 | 6/2001 | Harkonen et al. |
| 6,251,190 B1 | 6/2001 | Mak et al. |
| 6,258,713 B1 | 7/2001 | Yu et al. |
| 6,270,572 B1 | 8/2001 | Kim et al. |
| 6,271,148 B1 | 8/2001 | Kao et al. |
| 6,274,484 B1 | 8/2001 | Tsai et al. |
| 6,284,646 B1 | 9/2001 | Leem et al. |
| 6,287,965 B1 | 9/2001 | Kang et al. |
| 6,291,876 B1 | 9/2001 | Stumborg et al. |
| 6,294,836 B1 | 9/2001 | Paranjpe et al. |
| 6,305,314 B1 | 10/2001 | Sneh et al. |
| 6,306,216 B1 | 10/2001 | Kim et al. |
| 6,309,713 B1 | 10/2001 | Mak et al. |
| 6,309,966 B1 | 10/2001 | Govindarajan et al. |
| 6,316,098 B1 | 11/2001 | Yitzchaik et al. |
| 6,319,826 B1 | 11/2001 | Chen et al. |
| 6,326,297 B1 | 12/2001 | Vijayendran |
| 6,333,260 B1 | 12/2001 | Kwon et al. |
| 6,335,280 B1 | 1/2002 | van der Jeugd |
| 6,342,277 B1 | 1/2002 | Sherman |
| 6,355,561 B1 | 3/2002 | Sandhu et al. |
| 6,358,829 B2 | 3/2002 | Yoon et al. |
| 6,365,502 B1 | 4/2002 | Paranjpe et al. |
| 6,368,954 B1 | 4/2002 | Lopatin et al. |
| 6,369,430 B1 | 4/2002 | Adetutu et al. |
| 6,372,598 B2 | 4/2002 | Kang et al. |
| 6,391,785 B1 | 5/2002 | Satta et al. |
| 6,399,491 B2 | 6/2002 | Jeon et al. |
| 6,416,822 B1 | 7/2002 | Chiang et al. |
| 6,420,189 B1 | 7/2002 | Lopatin |
| 6,423,619 B1 | 7/2002 | Grant et al. |
| 6,426,555 B1 | 7/2002 | Hsia et al. |
| 6,428,859 B1 | 8/2002 | Chiang et al. |
| 6,447,933 B1 | 9/2002 | Wang et al. |
| 6,451,119 B2 | 9/2002 | Sneh et al. |
| 6,451,695 B2 | 9/2002 | Sneh |
| 6,468,924 B2 | 10/2002 | Lee et al. |
| 6,475,276 B1 | 11/2002 | Elers et al. |
| 6,475,910 B1 | 11/2002 | Sneh |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,498,091 B1 | 12/2002 | Chen et al. |
| 6,524,952 B1 | 2/2003 | Srinivas et al. |
| 6,534,395 B2 | 3/2003 | Werkhoven et al. |
| 6,534,404 B1 | 3/2003 | Danek et al. |
| 6,551,929 B1 | 4/2003 | Kori et al. |
| 6,569,501 B2 | 5/2003 | Chiang et al. |
| 6,599,572 B2 | 7/2003 | Saanila et al. |
| 6,607,976 B2 | 8/2003 | Chen et al. |
| 6,620,723 B1 | 9/2003 | Byun et al. |
| 6,627,995 B2 | 9/2003 | Paranjpe et al. |
| 6,630,201 B2 | 10/2003 | Chiang et al. |
| 6,635,965 B1 | 10/2003 | Lee et al. |
| 6,645,847 B2 | 11/2003 | Paranjpe et al. |
| 6,660,126 B2 | 12/2003 | Nguyen et al. |
| 6,686,271 B2 | 2/2004 | Raaijmakers et al. |
| 6,718,126 B2 | 4/2004 | Lei |
| 6,740,585 B2 | 5/2004 | Yoon et al. |
| 6,772,072 B2 | 8/2004 | Ganguli et al. |
| 6,777,352 B2 | 8/2004 | Tepman et al. |
| 6,790,773 B1 | 9/2004 | Drewery et al. |
| 6,797,340 B2 | 9/2004 | Fang et al. |
| 6,797,608 B1 | 9/2004 | Lin |
| 6,809,026 B2 | 10/2004 | Yoon et al. |
| 6,812,126 B1 | 11/2004 | Paranjpe et al. |
| 6,814,087 B2 | 11/2004 | Chandran et al. |
| 6,815,285 B2 | 11/2004 | Choi et al. |
| 6,818,250 B2 | 11/2004 | George et al. |
| 6,821,563 B2 | 11/2004 | Yudovsky |
| 6,827,978 B2 | 12/2004 | Yoon et al. |
| 6,831,004 B2 | 12/2004 | Byun et al. |
| 6,833,161 B2 | 12/2004 | Wang et al. |
| 6,838,376 B2 | 1/2005 | Matsuse et al. |
| 6,846,516 B2 | 1/2005 | Yang et al. |
| 6,855,368 B1 | 2/2005 | Kori et al. |
| 6,861,356 B2 | 3/2005 | Matsuse et al. |
| 6,875,271 B2 | 4/2005 | Glenn et al. |
| 6,893,915 B2 | 5/2005 | Park et al. |
| 6,905,541 B2 | 6/2005 | Chen et al. |
| 6,915,592 B2 | 7/2005 | Guenther |
| 6,932,871 B2 | 8/2005 | Chang et al. |
| 6,936,538 B2 | 8/2005 | Byun |
| 6,939,804 B2 | 9/2005 | Lai et al. |
| 6,951,804 B2 | 10/2005 | Seutter et al. |
| 6,955,211 B2 | 10/2005 | Ku et al. |
| 6,958,174 B1 | 10/2005 | Klaus et al. |
| 6,998,014 B2 | 2/2006 | Chen et al. |
| 7,005,372 B2 | 2/2006 | Levy et al. |
| 7,026,238 B2 | 4/2006 | Xi et al. |
| 7,033,922 B2 | 4/2006 | Kori et al. |
| 7,094,680 B2 | 8/2006 | Seutter et al. |
| 7,101,795 B1 | 9/2006 | Xi et al. |
| 7,115,494 B2 | 10/2006 | Sinha et al. |
| 7,115,499 B2 | 10/2006 | Wang et al. |
| 7,141,494 B2 | 11/2006 | Lee et al. |
| 7,186,385 B2 | 3/2007 | Ganguli et al. |
| 7,208,413 B2 | 4/2007 | Byun et al. |
| 7,211,144 B2 | 5/2007 | Lu et al. |
| 7,211,508 B2 | 5/2007 | Chung et al. |
| 7,220,673 B2 | 5/2007 | Xi et al. |

| | | |
|---|---|---|
| 7,238,552 B2 | 7/2007 | Byun |
| 7,262,125 B2 | 8/2007 | Wongsenakhum et al. |
| 7,279,432 B2 | 10/2007 | Xi et al. |
| 7,384,867 B2 | 6/2008 | Lai et al. |
| 7,405,158 B2 | 7/2008 | Lai et al. |
| 7,408,225 B2 | 8/2008 | Shinriki et al. |
| 7,416,979 B2 | 8/2008 | Yoon et al. |
| 7,429,516 B2 | 9/2008 | Wang et al. |
| 7,465,665 B2 | 12/2008 | Xi et al. |
| 7,465,666 B2 | 12/2008 | Kori et al. |
| 2001/0000866 A1 | 5/2001 | Sneh et al. |
| 2001/0002280 A1 | 5/2001 | Sneh |
| 2001/0009140 A1 | 7/2001 | Bondestam et al. |
| 2001/0009695 A1 | 7/2001 | Saanila et al. |
| 2001/0011526 A1 | 8/2001 | Doering et al. |
| 2001/0024387 A1 | 9/2001 | Raaijmakers et al. |
| 2001/0028924 A1 | 10/2001 | Sherman |
| 2001/0029094 A1 | 10/2001 | Mee-Young et al. |
| 2001/0031562 A1 | 10/2001 | Raaijmakers et al. |
| 2001/0034123 A1 | 10/2001 | Jeon et al. |
| 2001/0041250 A1 | 11/2001 | Werkhoven et al. |
| 2001/0042799 A1 | 11/2001 | Kim et al. |
| 2001/0054730 A1 | 12/2001 | Kim et al. |
| 2001/0054769 A1 | 12/2001 | Raaijmakers et al. |
| 2002/0000598 A1 | 1/2002 | Kang et al. |
| 2002/0004293 A1 | 1/2002 | Soininen et al. |
| 2002/0007790 A1 | 1/2002 | Park |
| 2002/0019121 A1 | 2/2002 | Pyo |
| 2002/0031618 A1 | 3/2002 | Sherman |
| 2002/0037630 A1 | 3/2002 | Agarwal et al. |
| 2002/0048880 A1 | 4/2002 | Lee |
| 2002/0052097 A1 | 5/2002 | Park |
| 2002/0055235 A1 | 5/2002 | Agarwal et al. |
| 2002/0060363 A1 | 5/2002 | Xi et al. |
| 2002/0061612 A1 | 5/2002 | Sandhu et al. |
| 2002/0068458 A1 | 6/2002 | Chiang et al. |
| 2002/0073924 A1 | 6/2002 | Chiang et al. |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0076837 A1 | 6/2002 | Hujanen et al. |
| 2002/0086111 A1 | 7/2002 | Byun et al. |
| 2002/0086507 A1 | 7/2002 | Park et al. |
| 2002/0090829 A1 | 7/2002 | Sandhu et al. |
| 2002/0094689 A1 | 7/2002 | Park |
| 2002/0104481 A1 | 8/2002 | Chiang et al. |
| 2002/0105055 A1 | 8/2002 | Buchanan et al. |
| 2002/0105088 A1 | 8/2002 | Yang et al. |
| 2002/0106536 A1 | 8/2002 | Lee et al. |
| 2002/0106846 A1 | 8/2002 | Seutter et al. |
| 2002/0109168 A1 | 8/2002 | Kim et al. |
| 2002/0117399 A1 | 8/2002 | Chen et al. |
| 2002/0121241 A1 | 9/2002 | Nguyen et al. |
| 2002/0121342 A1 | 9/2002 | Nguyen et al. |
| 2002/0121697 A1 | 9/2002 | Marsh |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0182320 A1 | 12/2002 | Leskela et al. |
| 2002/0187256 A1 | 12/2002 | Elers et al. |
| 2002/0187631 A1 | 12/2002 | Kim et al. |
| 2002/0197402 A1 | 12/2002 | Chiang et al. |
| 2002/0197856 A1 | 12/2002 | Matsuse et al. |
| 2002/0197863 A1 | 12/2002 | Mak et al. |
| 2003/0013300 A1 | 1/2003 | Byun |
| 2003/0013320 A1 | 1/2003 | Kim et al. |
| 2003/0022487 A1 | 1/2003 | Yoon et al. |
| 2003/0029715 A1 | 2/2003 | Yu et al. |
| 2003/0031807 A1 | 2/2003 | Elers et al. |
| 2003/0032281 A1 | 2/2003 | Werkhoven et al. |
| 2003/0034560 A1 | 2/2003 | Matsuse et al. |
| 2003/0038369 A1 | 2/2003 | Layadi et al. |
| 2003/0049931 A1 | 3/2003 | Byun et al. |
| 2003/0049942 A1 | 3/2003 | Haukka et al. |
| 2003/0053799 A1 | 3/2003 | Lei |
| 2003/0054631 A1 | 3/2003 | Raaijmakers et al. |
| 2003/0072975 A1 | 4/2003 | Shero et al. |
| 2003/0082296 A1 | 5/2003 | Elers et al. |
| 2003/0082301 A1 | 5/2003 | Chen et al. |
| 2003/0104126 A1 | 6/2003 | Fang et al. |
| 2003/0116087 A1 | 6/2003 | Nguyen et al. |
| 2003/0123216 A1 | 7/2003 | Yoon et al. |
| 2003/0127043 A1 | 7/2003 | Lu et al. |
| 2003/0129826 A1 | 7/2003 | Werkhoven et al. |
| 2003/0134508 A1 | 7/2003 | Raaijmakers et al. |
| 2003/0143328 A1 | 7/2003 | Chen et al. |
| 2003/0143839 A1 | 7/2003 | Raaijmakers et al. |
| 2003/0153177 A1 | 8/2003 | Tepman et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0181035 A1 | 9/2003 | Yoon et al. |
| 2003/0186495 A1 | 10/2003 | Saanila et al. |
| 2003/0190423 A1 | 10/2003 | Yang et al. |
| 2003/0190804 A1 | 10/2003 | Glenn et al. |
| 2003/0194493 A1 | 10/2003 | Chang et al. |
| 2003/0194825 A1 | 10/2003 | Law et al. |
| 2003/0203616 A1 | 10/2003 | Chung et al. |
| 2003/0224217 A1 | 12/2003 | Byun et al. |
| 2003/0232497 A1 | 12/2003 | Xi et al. |
| 2004/0005749 A1 | 1/2004 | Choi et al. |
| 2004/0009307 A1 | 1/2004 | Koh et al. |
| 2004/0011504 A1 | 1/2004 | Ku et al. |
| 2004/0013577 A1 | 1/2004 | Ganguli et al. |
| 2004/0014315 A1 | 1/2004 | Lai et al. |
| 2004/0014320 A1 | 1/2004 | Chen et al. |
| 2004/0015300 A1 | 1/2004 | Ganguli et al. |
| 2004/0018304 A1 | 1/2004 | Chung et al. |
| 2004/0018723 A1 | 1/2004 | Byun et al. |
| 2004/0025370 A1 | 2/2004 | Guenther |
| 2004/0041320 A1 | 3/2004 | Hodumi |
| 2004/0065255 A1 | 4/2004 | Yang et al. |
| 2004/0067641 A1 | 4/2004 | Yudovsky |
| 2004/0170403 A1 | 9/2004 | Lei |
| 2004/0202786 A1 | 10/2004 | Wongsenakhum et al. |
| 2004/0209460 A1 | 10/2004 | Xi et al. |
| 2004/0209465 A1 | 10/2004 | Xi et al. |
| 2004/0211665 A1 | 10/2004 | Yoon et al. |
| 2004/0247788 A1 | 12/2004 | Fang et al. |
| 2005/0006799 A1 | 1/2005 | Gregg et al. |
| 2005/0008779 A1 | 1/2005 | Yang et al. |
| 2005/0009325 A1 | 1/2005 | Chung et al. |
| 2005/0031786 A1 | 2/2005 | Lee et al. |
| 2005/0059241 A1 | 3/2005 | Kori et al. |
| 2005/0118804 A1 | 6/2005 | Byun et al. |
| 2005/0164487 A1 | 7/2005 | Seutter et al. |
| 2005/0176240 A1 | 8/2005 | Wang et al. |
| 2005/0189072 A1 | 9/2005 | Chen et al. |
| 2005/0191803 A1 | 9/2005 | Matsuse et al. |
| 2005/0208217 A1 | 9/2005 | Shinriki et al. |
| 2005/0208763 A1 | 9/2005 | Byun |
| 2005/0257735 A1 | 11/2005 | Guenther |
| 2005/0271814 A1 | 12/2005 | Chang et al. |
| 2005/0287807 A1 | 12/2005 | Lai et al. |
| 2006/0009034 A1 | 1/2006 | Lai et al. |
| 2006/0024959 A1 | 2/2006 | Li et al. |
| 2006/0030148 A1 | 2/2006 | Seutter et al. |
| 2006/0040052 A1 | 2/2006 | Fang et al. |
| 2006/0075966 A1 | 4/2006 | Chen et al. |
| 2006/0128132 A1 | 6/2006 | Sinha et al. |
| 2006/0128150 A1 | 6/2006 | Gandikota et al. |
| 2006/0156979 A1 | 7/2006 | Thakur et al. |

| | | | | | |
|---|---|---|---|---|---|
| 2006/0199372 A1 | 9/2006 | Chung et al. | JP | 01117017 | 5/1989 |
| 2006/0257295 A1 | 11/2006 | Chen et al. | JP | 01143221 | 6/1989 |
| 2006/0264031 A1 | 11/2006 | Xi et al. | JP | 01143233 | 6/1989 |
| 2006/0276020 A1 | 12/2006 | Yoon et al. | JP | 01154511 | 6/1989 |
| 2006/0292874 A1 | 12/2006 | Kori et al. | JP | 01236657 | 9/1989 |
| 2007/0003698 A1 | 1/2007 | Chen et al. | JP | 01245512 | 9/1989 |
| 2007/0009658 A1 | 1/2007 | Yoo et al. | JP | 01264218 | 10/1989 |
| 2007/0020890 A1 | 1/2007 | Thakur et al. | JP | 01270593 | 10/1989 |
| 2007/0020924 A1 | 1/2007 | Wang et al. | JP | 01272108 | 10/1989 |
| 2007/0026147 A1 | 2/2007 | Chen et al. | JP | 01290221 | 11/1989 |
| 2007/0067609 A1 | 3/2007 | Chen et al. | JP | 01290222 | 11/1989 |
| 2007/0099415 A1 | 5/2007 | Chen et al. | JP | 01296673 | 11/1989 |
| 2007/0119370 A1 | 5/2007 | Ma et al. | JP | 01303770 | 12/1989 |
| 2007/0119371 A1 | 5/2007 | Ma et al. | JP | 01305894 | 12/1989 |
| 2007/0128862 A1 | 6/2007 | Ma et al. | JP | 01313927 | 12/1989 |
| 2007/0128863 A1 | 6/2007 | Ma et al. | JP | 02012814 | 1/1990 |
| 2007/0128864 A1 | 6/2007 | Ma et al. | JP | 02014513 | 1/1990 |
| 2007/0190780 A1 | 8/2007 | Chung et al. | JP | 02017634 | 1/1990 |
| 2007/0197027 A1 | 8/2007 | Byun et al. | JP | 02063115 | 3/1990 |
| 2007/0197028 A1 | 8/2007 | Byun et al. | JP | 02074029 | 3/1990 |
| 2008/0008823 A1 | 1/2008 | Chen et al. | JP | 02074587 | 3/1990 |
| 2008/0014352 A1 | 1/2008 | Xi et al. | JP | 02106822 | 4/1990 |
| 2008/0014724 A1 | 1/2008 | Byun | JP | 02129913 | 5/1990 |
| 2008/0206987 A1 | 8/2008 | Gelatos et al. | JP | 02162717 | 6/1990 |
| 2008/0227291 A1 | 9/2008 | Lai et al. | JP | 02172895 | 7/1990 |
| 2008/0268636 A1 | 10/2008 | Yoon et al. | JP | 02196092 | 8/1990 |
| 2008/0305629 A1 | 12/2008 | Wang et al. | JP | 02203517 | 8/1990 |
| 2008/0317954 A1 | 12/2008 | Lu et al. | JP | 02230690 | 9/1990 |
| 2009/0087550 A1* | 4/2009 | Leusink et al. ........... 427/126.1 | JP | 02230722 | 9/1990 |
| | | | JP | 02246161 | 10/1990 |
| | | | JP | 02264491 | 10/1990 |
| FOREIGN PATENT DOCUMENTS | | | JP | 02283084 | 11/1990 |
| DE | 19820147 | 7/1999 | JP | 02304916 | 12/1990 |
| EP | 0344352 | 12/1989 | JP | 03019211 | 1/1991 |
| EP | 0429270 | 5/1991 | JP | 03022569 | 1/1991 |
| EP | 0442490 | 8/1991 | JP | 03023294 | 1/1991 |
| EP | 0799641 | 10/1997 | JP | 03023299 | 1/1991 |
| EP | 1167567 | 1/2002 | JP | 03044967 | 2/1991 |
| EP | 1167569 | 1/2002 | JP | 03048421 | 3/1991 |
| FR | 2626110 | 7/1989 | JP | 03070124 | 3/1991 |
| FR | 2692597 | 12/1993 | JP | 03185716 | 8/1991 |
| GB | 2355727 | 5/2001 | JP | 03208885 | 9/1991 |
| JP | 58098917 | 6/1983 | JP | 03234025 | 10/1991 |
| JP | 58100419 | 6/1983 | JP | 03286522 | 12/1991 |
| JP | 60065712 | 4/1985 | JP | 03286531 | 12/1991 |
| JP | 61035847 | 2/1986 | JP | 04031391 | 2/1992 |
| JP | 61210623 | 9/1986 | JP | 04031396 | 2/1992 |
| JP | 62069508 | 3/1987 | JP | 04100292 | 4/1992 |
| JP | 62091495 | 4/1987 | JP | 04111418 | 4/1992 |
| JP | 62141717 | 6/1987 | JP | 04132214 | 5/1992 |
| JP | 62167297 | 7/1987 | JP | 04132681 | 5/1992 |
| JP | 62171999 | 7/1987 | JP | 04151822 | 5/1992 |
| JP | 62232919 | 10/1987 | JP | 04162418 | 6/1992 |
| JP | 63062313 | 3/1988 | JP | 04175299 | 6/1992 |
| JP | 63085098 | 4/1988 | JP | 04186824 | 7/1992 |
| JP | 63090833 | 4/1988 | JP | 04212411 | 8/1992 |
| JP | 63222420 | 9/1988 | JP | 04260696 | 9/1992 |
| JP | 63222421 | 9/1988 | JP | 04273120 | 9/1992 |
| JP | 63227007 | 9/1988 | JP | 04285167 | 10/1992 |
| JP | 63252420 | 10/1988 | JP | 04291916 | 10/1992 |
| JP | 63266814 | 11/1988 | JP | 04325500 | 11/1992 |
| JP | 64009895 | 1/1989 | JP | 04328874 | 11/1992 |
| JP | 64009896 | 1/1989 | JP | 05029228 | 2/1993 |
| JP | 64009897 | 1/1989 | JP | 05047665 | 2/1993 |
| JP | 64037832 | 2/1989 | JP | 05047666 | 2/1993 |
| JP | 64082615 | 3/1989 | JP | 05047668 | 2/1993 |
| JP | 64082617 | 3/1989 | JP | 05074717 | 3/1993 |
| JP | 64082671 | 3/1989 | JP | 05074724 | 3/1993 |
| JP | 64082676 | 3/1989 | JP | 05102189 | 4/1993 |
| JP | 01103982 | 4/1989 | JP | 05160152 | 6/1993 |
| JP | 01103996 | 4/1989 | JP | 05175143 | 7/1993 |
| JP | 64090524 | 4/1989 | JP | 05175145 | 7/1993 |
| | | | JP | 05182906 | 7/1993 |

| | | |
|---|---|---|
| JP | 05186295 | 7/1993 |
| JP | 05206036 | 8/1993 |
| JP | 05234899 | 9/1993 |
| JP | 05235047 | 9/1993 |
| JP | 05251339 | 9/1993 |
| JP | 05270997 | 10/1993 |
| JP | 05283336 | 10/1993 |
| JP | 05291152 | 11/1993 |
| JP | 05304334 | 11/1993 |
| JP | 05343327 | 12/1993 |
| JP | 05343685 | 12/1993 |
| JP | 06045606 | 2/1994 |
| JP | 06132236 | 5/1994 |
| JP | 06177381 | 6/1994 |
| JP | 06196809 | 7/1994 |
| JP | 06222388 | 8/1994 |
| JP | 06224138 | 8/1994 |
| JP | 06230421 | 8/1994 |
| JP | 06252057 | 9/1994 |
| JP | 06291048 | 10/1994 |
| JP | 07070752 | 3/1995 |
| JP | 07086269 | 3/1995 |
| JP | 07300649 | 11/1995 |
| JP | 08181076 | 7/1996 |
| JP | 08245291 | 9/1996 |
| JP | 08264530 | 10/1996 |
| JP | 09260786 | 10/1997 |
| JP | 09293681 | 11/1997 |
| JP | 10188840 | 7/1998 |
| JP | 10190128 | 7/1998 |
| JP | 10308283 | 11/1998 |
| JP | 11269652 | 10/1999 |
| JP | 2000031387 | 1/2000 |
| JP | 2000058777 | 2/2000 |
| JP | 2000068072 | 3/2000 |
| JP | 2000087029 | 3/2000 |
| JP | 2000138094 | 5/2000 |
| JP | 2000178735 | 6/2000 |
| JP | 2000218445 | 8/2000 |
| JP | 2000319772 | 11/2000 |
| JP | 2000340883 | 12/2000 |
| JP | 2000353666 | 12/2000 |
| JP | 2001020075 | 1/2001 |
| JP | 2001062244 | 3/2001 |
| JP | 2001111000 | 4/2001 |
| JP | 2001152339 | 6/2001 |
| JP | 2001172767 | 6/2001 |
| JP | 2001189312 | 7/2001 |
| JP | 2001217206 | 8/2001 |
| JP | 2001220287 | 8/2001 |
| JP | 2001220294 | 8/2001 |
| JP | 2001240972 | 9/2001 |
| JP | 2001254181 | 9/2001 |
| JP | 2001284042 | 10/2001 |
| JP | 2001303251 | 10/2001 |
| JP | 2001328900 | 11/2001 |
| JP | 2002060944 | 2/2002 |
| JP | 2002167672 | 6/2002 |
| JP | 2002172767 | 6/2002 |
| WO | WO-9002216 | 3/1990 |
| WO | WO-9110510 | 7/1991 |
| WO | WO-9302111 | 2/1993 |
| WO | WO-9617107 | 6/1996 |
| WO | WO-9618756 | 6/1996 |
| WO | WO-9806889 | 2/1998 |
| WO | WO-9851838 | 11/1998 |
| WO | WO-9901595 A1 | 1/1999 |
| WO | WO-9913504 | 3/1999 |
| WO | WO-9919260 | 4/1999 |
| WO | WO-9929924 A1 | 6/1999 |
| WO | WO-9941423 | 8/1999 |
| WO | WO-0011721 | 3/2000 |
| WO | WO-0015865 A1 | 3/2000 |
| WO | WO-0015881 A2 | 3/2000 |
| WO | WO-0016377 A2 | 3/2000 |
| WO | WO-0054320 | 9/2000 |
| WO | WO-0063957 A1 | 10/2000 |
| WO | WO-0079019 A1 | 12/2000 |
| WO | WO-0079576 A1 | 12/2000 |
| WO | WO-0115220 | 3/2001 |
| WO | WO-0127346 | 4/2001 |
| WO | WO-0127347 | 4/2001 |
| WO | WO-0129280 | 4/2001 |
| WO | WO-0129891 | 4/2001 |
| WO | WO-0129893 | 4/2001 |
| WO | WO-0136702 A1 | 5/2001 |
| WO | WO-0140541 A1 | 6/2001 |
| WO | WO-0166832 | 9/2001 |
| WO | WO-0201628 | 1/2002 |
| WO | WO-0245167 | 6/2002 |
| WO | WO-0245871 | 6/2002 |
| WO | WO-0246489 | 6/2002 |
| WO | WO-02067319 | 8/2002 |
| WO | WO-2004106584 | 12/2004 |
| WO | WO-2005027211 | 3/2005 |

OTHER PUBLICATIONS

Buerke, et al. "PNL™ low Resistivity tungsten for contact fill," Conference Proceedings AMC XXI, 2006, Materials Research Society, pp. 221-226.

Cheong, et al. "The Evaluation of ALD-WN/W Process for Sub-70nm Contact Plug Technology," ALD 2005 Conference.

Elam, et al. "Kinetics of the $WF_6$ and $Si_2H_6$ surface reactions during tungsten atomic layer deposition," Surface Science, 479, 2001, pp. 121-135.

Elam, et al. "Nucleation and Growth During Tungsten Atomic Layer Deposition on $SiO_2$ Surfaces," Thin Solid Films, 386, (2001), pp. 41-52.

Fabreguette, et al. "Quartz crystal microbalance study of tungsten atomic layer deposition using $WF_6$ and $Si_2H_6$," Thin Solid Films, 488, 2005, pp. 103-110.

Fabreguette, et al. "Ultrahigh x-ray reflectivity from $W/Al_2O_3$ multilayers fabricated using atomic layer deposition," Applied Physics Letter, 88, 2006, pp. 013116-1-013116-3.

Frohberg et al. "Filling contacts using a pulsed nucleation later of tungsten nitride," Micro: TechEmergent, Mar. 27, 2006, pp. 1-10, <http://www.micormagazine.com/archive/05/10/frohberg.html>.

Goswami, et al. "Transition Metals Show Promise as Copper Barriers," Semiconductor International, ATMI, San Jose—May 1, 2004, Semiconductor International, pp. 1-7.

Grubbs, et al. "Gas phase reaction products during tungsten atomic layer deposition using $WF_6$ and $Si_2H_6$," J. Vac. Sci. Technol., B, vol. 22, No. 4, Jul./Aug. 2004, American Vacuum Society, pp. 1811-1821.

Grubbs, et al. "Nucleation and growth during the atomic layer deposition of W on $Al_2O_3$ and $Al_2O_3$ on W," Thin Solid Films, 467, 2004, pp. 16-27.

Kang "Applications and challenges of atomic layer deposition for semiconductor process," AVS 5th International Conference on Atomic Layer Deposition 2005, Aug. 8-10, 2005, San Jose, CA.

Kim et al. "Atomic layer deposited tungsten nitride thin film as contact barrier layer for sub-80 nm dynamic random access memory," Conference Proceedings AMC XXI, 2006 Materials Research Society.

Kim et al. "Atomic Layer Deposition of Low Resistivity and High-Density Tungsten Nitride Thin Film Using $B_2H_6$, $WF_6$ and $NH_3$," Electrochem. Solid-State Lett., vol. 9, Issue 3, (2006), pp. C54-C57.

Klaus et al. "Atomic Layer Deposition of Tungsten Using Sequential Surface Chemistry with a Sacrificial Stripping Reaction," Thin Solid Films, 360, 2000, pp. 145-153.

Klaus, et al. "Atomic Layer Deposition of Tungsten Nitride Films Using Sequential Surface Reactions," Journal of the Electrochemical Society, vol. 147, No. 3, 2000, pp. 1175-1181.

Klaus, et al. "Atomically Controlled Growth of Tungsten and Tungsten Nitride Using Sequential Surface Reactions," Applied Surface Science, 162-163 (2000), pp. 479-491.

Lee, et al. "Pulsed Nucleation for Ultra-High Aspect Ratio Tungsten Plugfill," Conference Proceedings ULSI XVIII, Materials Research Society, 2002, pp. 649-653.

PCT International Search Report and Written Opinion dated Dec. 8, 2008 for International Application No. PCT/US 08/77561. (APPM/011867PC).

Sechrist, et al. "Optimization and Structural Characterization of W/$Al_2O_3$ Nanolaminates Grown Using Atomic Layer Deposition Techniques," Chem. Matter, 17, 2005, American Chemical Society, pp. 3475-3485.

Yang, et al. "Atomic Layer Deposition of Tungsten Film from $WF_6$/$B_2H_6$: Nucleation Layer for Advanced Semiconductor Devices," Conference Proceedings ULSI XVII (2002), Materials Research Society, pp. 655-660.

Bader, et al. "Integrated Processing Equipment", Solid State Technology, Cowan Pub., vol. 33, No. 5 (May 1, 1990), pp. 149-154.

Bedair "Atomic Layer Epitaxy Deposition Processes", J. Vac. Sci. Techol. 12(1) (Jan./Feb. 1994).

Choi, et al. "Stability of $TiB_2$ as a Diffusion Barrier on Silicon", J. Electrochem. Soc. 138(10) (Oct. 1991), pp. 3062-3067.

Choi, et al. "The effect of annealing on resistivity of low pressure chemical vapor depositied titanium diboride", J. Appl. Phys. 69(11) (Jun. 1, 1991), pp. 7853-7861.

Derbyshire "Applications of Integrated Processing", Solid State Technology, US, Cowan Pub., vol. 37, No. 12 (Dec. 1, 1994), pp. 45-47.

Elers, et al. "$NbCl_5$ As A Precursor In Atomic Layer Epitaxy", Appl. Surf. Sci., vol. 82/83 (1994), pp. 468-474.

George, et al. "Atomic layer controlled deposition of $SiO_2$ and $Al_2O_3$ using ABAB . . . binary reaction sequence chemistry", Appl. Surf. Sci., vol. 82/83 (1994), pp. 460.

George, et al. "Surface Chemistry for Atomic Layer Growth", J. Phys. Chem., vol. 100 (1996), pp. 13121-13131.

Hultman, et al. "Review of the thermal and mechanical stability of TiN-based thin films", Zeitschrift Fur Metallkunde, 90(10) (Oct. 1999), pp. 803-813.

IBM Tech. Disc. Bull. Knowledge-Based Dynamic Scheduler in Distributed Computer Control, (Jun. 1990), pp. 80-84.

IBM Tech. Disc. Bull. "Multiprocessor and Multitasking Architecture for Tool Control of the Advanced via Inspection Tools" (May 1992), pp. 190-191.

Kitigawa, et al. "Hydrogen-mediated low temperature epitaxy of Si in plasma-enhanced chemical vapor deposition", Applied Surface Science (2000), pp. 30-34.

Klaus, et al. "Atomic Layer Deposition of SiO2 Using Catalyzed and Uncatalyzed Self-Limiting Surface Reactions", Surface Review & Letters, 6(3&4) (1999), pp. 435-448.

Lee "The Preparation of Titanium-Based Thin Film by CVD Using Titanium Chlorides as precursors", Chemical Vapor Deposition, 5(2) (Mar. 1999), pp. 69-73.

Martensson, et al. "Atomic Layer Epitaxy of Copper, Growth & Selectivity in the Cu (II)-2,2.6,6-Tetramethyl-3, 5-Heptanedion ATE/H2 Process", J. Electrochem. Soc., 145(8) (Aug. 1998), pp. 2926-2931.

Martensson, et al. "Atomic Layer Eptiaxy of Copper and Tantalum," Chem. Vap. Deposition (1997) vol. 3, No. 1.

Maydan, et al. "Cluster Tools for Fabrication of Advanced Devices" Jap. J. of Applied Physics, Extended Abstracts, 22nd Conference Solid State Devices and Materials (1990), pp. 849-852.

McGeachin "Synthesis and properties of some β-diketimines derived from acetylacetone, and their metal complexes", Canadian J. of Chemistry, vol. 46 (1968), pp. 1903-1912.

Min, et al. "Atomic layer deposition of TiN thin films by sequential introduction of Ti precursor and NH3", Symp.: Advanced Interconnects and Contact Materials and Processes for Future Integrated Circuits (Apr. 13-16, 1998) pp. 337-342.

Min, et al. "Chemical Vapor Deposition of Ti-Si-N. Films with Alternating Source Supply", Mat., Res. Soc. Symp. Proc., vol. 564 (Apr. 5, 1999), pp. 207-210.

Min, et al. "Metal-Organic Atomic-Layer Deposition of Titanium-NitrideFilms", Applied Physics Letters, American Inst. Of Physics, vol. 75(11) (Sep. 13, 1999).

Niinisto, et al. "Synthesis of oxide thin films and overlayers by atomic layer epitaxy for advanced applications", Materials Science and Engineering B41, 1996, pp. 23-29.

Ohba, et al. "Thermal Decomposition of Methylhydrazine and Deposition Properties of CVD TiN Thin Films", Conference Proceedings, Advanced Metallization for ULSI Applications in 1993 (1994), pp. 143-149.

Ritala, et al. "Atomic Layer Epitaxy Growth of TiN Thin Films", J. Electrochem. Soc., 142(8) (Aug. 1995), pp. 2731-2737.

Ritala, et al. "Perfectly Conformal TiN and Al2O3 Films Deposited by Atomic Layer Deposition", Chemical Vapor Deposition, ISSN 0948-1907, CVDEFX, vol. 5, Jan. 1999, No. 1, pp. 7-9.

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Scheper, et al. "Low-temperature deposition of titanium nitride films from dialkylhydrazine-based precursors", Materials Science in Semiconductor Processing 2 (1999), pp. 149-157.

Solanki, et al. "Atomic Layer deposition of Copper Seed Layers", Electrochemical and Solid State Letters, 3(10) (2000), pp. 479-480.

Suzuki, et al. "A 0.2-μm contact filing by 450°C-hydrazine-reduced TiN film with low resistivity", IEDM 92-979, pp. 11.8.1-11.8.3.

Suzuki, et al. "LPCVD-TiN Using Hydrazine and $TiCl_4$", VMIC Conference (Jun. 8-9, 1993), pp. 418-423.

Wise, et al. "Diethyldiethoxysilane as a new precursor for $SiO_2$ growth on silicon", Mat. Res. Soc. Symp. Proc., vol. 334 (1994), p. 37.

Yamaga, et al. "Atomic Layer Epitaxy Of ZnS By A New Gas Supplying System In A Low-Pressure Metalorganic Vapor Phase Epitaxy", J. of Crystal Growth 117 (1992), pp. 152-155.

Yamaguchi, et al. "Atomic-layer chemical-vapor-deposition of silicon dioxide films with extremely low hydrogen content", Appl. Surf. Sci., vol. 130-132 (1998), pp. 202-207.

* cited by examiner

VAPOR DEPOSITION OF TUNGSTEN MATERIALS

CROSS-REFERENCE TO RELATED APPLICATIONS

This application claims benefit of U.S. Ser. No. 60/976,120, filed on Sep. 28, 2007, which is hereby incorporated by reference in its entirety. This application is also a continuation-in-part of U.S. Ser. No. 12/121,209, filed on May 15, 2008, which claims benefit of U.S. Ser. No. 60/938,124, filed on May 15, 2007, and is a continuation-in-part of U.S. Ser. No. 11/038,592, filed Jan. 19, 2005, and issued as U.S. Pat. No. 7,405,158, which are hereby incorporated by reference in their entirety. U.S. Ser. No. 11/038,592 is a continuation-in-part of U.S. Ser. No. 10/418,728, filed on Apr. 18, 2003 now abandoned, which is a continuation-in-part of U.S. Ser. No. 10/268,195, filed Oct. 10, 2002, and issued as U.S. Pat. No. 6,797,340, which claims benefit of U.S. Ser. No. 60/328,451, filed on Oct. 10, 2001, which are hereby incorporated by reference in their entirety. U.S. Ser. No. 11/038,592 is also a continuation-in-part of U.S. Ser. No. 10/879,448, filed Jun. 29, 2004 now abandoned, which is a continuation of U.S. Ser. No. 10/268,195, filed Oct. 10, 2002, and issued as U.S. Pat. No. 6,797,340, which claims benefit of U.S. Ser. No. 60/328,451, filed on Oct. 10, 2001, which are hereby incorporated by reference in their entirety. U.S. Ser. No. 11/038,592 is also a continuation-in-part of U.S. Ser. No. 10/762,764, filed on Jan. 22, 2004, now abandoned, which is a continuation of U.S. Ser. No. 09/678,266, filed on Oct. 3, 2000, and issued as U.S. Pat. No. 7,101,795, which is a continuation-in-part of U.S. Ser. No. 09/605,593, filed on Jun. 28, 2000, and issued as U.S. Pat. No. 6,551,929, which are hereby incorporated by reference in their entirety. U.S. Ser. No. 11/038,592 is also a continuation-in-part of U.S. Ser. No. 10/196,514, filed on Jul. 15, 2002 now U.S. Pat. No. 6,936,538, which claims benefit of U.S. Ser. No. 60/305,765, filed on Jul. 16, 2001, which are hereby incorporated by reference in their entirety.

BACKGROUND OF THE INVENTION

1. Field of the Invention

Embodiments of the invention relate to the processing of substrates. More particularly, embodiments of the invention relate to deposition of tungsten materials on substrates using vapor deposition processes.

2. Description of the Related Art

Semiconductor and electronics processing industries continue to strive for larger production yields while increasing the uniformity of layers deposited on substrates having larger surface areas. These same factors in combination with new materials also provide higher integration of circuits per area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow technique to maintain adequate uniformity.

An alternative to CVD process is cyclical deposition or atomic layer deposition (ALD) that demonstrates excellent step coverage. Cyclical deposition or ALD evolved from atomic layer epitaxy (ALE) and employs chemisorption techniques to deliver precursor molecules on a substrate surface in sequential cycles. In simplest form, the cycle exposes the substrate surface to a first precursor, a purge gas, a second precursor, and the purge gas. The first and second precursors react to form a product compound as a film on the substrate surface. The cycle is repeated to form the layer to a desired thickness.

Formation of film layers at a high deposition rate while providing adequate step coverage are conflicting characteristics often necessitating the sacrifice of one to obtain the other. This conflict is true particularly when refractory metal layers are deposited over gaps or vias during the formation of contacts interconnecting adjacent metallic layers separated by dielectric layers. Historically, CVD techniques have been employed to deposit conductive materials such as refractory metals in order to inexpensively and quickly form contacts. Due to the increasing integration of semiconductor circuitry, tungsten has been used based upon superior step coverage. As a result, deposition of tungsten by CVD has wide application in electronic device and semiconductor processing due to the high throughput of the process.

Depositing tungsten by conventional CVD process, however, is attendant with several disadvantages. For example, conventional CVD processes usually cause high aspect ratio (e.g., 20) vias to "pinch-off" and not completely fill during deposition of tungsten films. Also, blanket deposition of a tungsten layer on a semiconductor substrate is time-consuming at temperatures below 400° C. The deposition rate of tungsten may be improved by increasing the deposition temperature to, for example, about 500° C. to about 550° C. However, temperatures in this higher range may compromise the structural and operational integrity of the underlying portions of the integrated circuit being formed. Further, tungsten has proven difficult to uniformly deposit, which typically increases film resistivity.

Therefore, there is a need for an improved process to deposit tungsten-containing materials with good uniformity using vapor deposition techniques.

SUMMARY OF THE INVENTION

Embodiments of the invention provide an improved process for depositing tungsten-containing materials. The process utilizes soak processes and vapor deposition process to provide tungsten-containing materials having significantly improved conductivity and surface uniformity, while increasing the production level throughput. In one embodiment, a method for forming a tungsten-containing material on a substrate is provided which includes positioning the substrate within a processing chamber, exposing the substrate to a continuous flow of a silicon precursor gas while exposing the substrate to intermittent pulses of a tungsten precursor gas to deposit a tungsten silicide layer thereon. The substrate is exposed to the silicon precursor gas and the tungsten precursor gas having a silicon/tungsten precursor flow rate ratio of greater than 1. In other examples, the silicon/tungsten precursor flow rate ratio may be about 2, about 3, or greater. The method further provides depositing a tungsten nitride layer on the tungsten silicide layer, depositing a tungsten nucleation layer on the tungsten nitride layer, and depositing a tungsten bulk layer on the tungsten nucleation layer. In some examples, the silicon precursor gas may be introduced into the processing chamber with a flow rate of about 120 sccm and the tungsten precursor gas may be introduced with a flow rate of about 60 sccm.

In some embodiments, the method further provides exposing the tungsten nitride barrier layer to a pre-soak gas containing a reducing agent during a pre-soak process prior to depositing the tungsten nucleation layer. In other embodiments, the method may include exposing the tungsten nucleation layer to a post-soak gas containing a reducing agent during a post-soak process. The reducing agent for the pre- or post-soak may independently contain silane, disilane, borane, diborane, phosphine, hydrogen, derivatives thereof, or combinations thereof.

In some examples, the substrate may be heated to a temperature within a range from about 350° C. to about 400° C., and more preferably, at about 380° C. during the vapor deposition process of the tungsten silicide layer. The processing chamber may have an internal pressure within a range from about 1 Torr to about 10 Torr, and more preferably, from about 5 Torr to about 10 Torr during the vapor deposition process of the tungsten silicide layer. The carrier gas may contain argon, nitrogen, hydrogen, or mixtures thereof and have a flow rate of about 3,600 sccm.

The tungsten silicide layer may be deposited by a vapor deposition process, such as by exposing the substrate to a continuous flow of a silicon precursor gas and exposing the substrate to intermittent pulses of a tungsten precursor gas to deposit the tungsten silicide layer. The tungsten silicide layer may have a resistivity measured across the substrate of about 225Ωμ-cm or less and a thickness within a range from about 30 Å to about 200 Å.

In another embodiment, a method for forming a tungsten-containing material on a substrate is provided which includes exposing the substrate to a continuous flow of a silicon precursor gas while exposing the substrate to intermittent pulses of a tungsten precursor gas to deposit a tungsten silicide layer. The method further provides depositing a tungsten nitride layer on the tungsten silicide layer during an ALD process, exposing the substrate to a pre-soak gas containing a reducing agent during a pre-soak process, depositing a tungsten nucleation layer on the tungsten nitride layer during another ALD process, exposing the tungsten nucleation layer to a post-soak gas containing the reducing agent during a post-soak process, and depositing a tungsten bulk layer on the tungsten nucleation layer.

In another embodiment, a method for forming a tungsten-containing material on a substrate is provided which includes positioning the substrate within a processing chamber, wherein the substrate already contains a tungsten silicide layer disposed thereon, and depositing a tungsten nitride layer on the tungsten silicide layer. The method further provides exposing the tungsten nitride layer to a pre-soak gas containing silane during a pre-soak process, exposing the substrate sequentially to a tungsten precursor and a reducing gas to deposit a tungsten nucleation layer on the tungsten nitride layer during an ALD process, exposing the substrate to a post-soak gas containing silane during a post-soak process, and depositing a tungsten bulk layer on the tungsten nucleation layer.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

DETAILED DESCRIPTION

Embodiments of the invention provide an improved process for depositing tungsten-containing materials. The process utilizes tungsten containing gas and vapor deposition process to provide tungsten-containing materials having significantly improved conductivity and surface uniformity, while increasing the production level throughput. In one embodiment, a method for forming a tungsten-containing material on a substrate is provided which includes exposing the substrate to a continuous flow of a silicon precursor gas and intermittent pulses of tungsten precursor gas to deposit a tungsten silicide layer on a substrate during a vapor deposition process. The substrate may be exposed to the silicon precursor gas and the tungsten precursor gas having a silicon/tungsten precursor flow rate ratio of greater than 1. In some examples, the silicon/tungsten precursor flow rate ratio is about 2:1 or greater, such as about 3:1 or greater. The silicon precursor gas may have a continuous flow rate, but does not necessary have a consistent flow rate. The tungsten precursor gas may be intermittent pulsed into the silicon precursor gas or otherwise into the processing chamber to expose the substrate.

Subsequently, in some embodiments, a tungsten nitride barrier layer may be deposited over the tungsten silicide layer. A tungsten nucleation layer may be deposited over the tungsten nitride barrier layer, and a tungsten bulk layer may be deposited over the tungsten nucleation layer.

Figure 1:
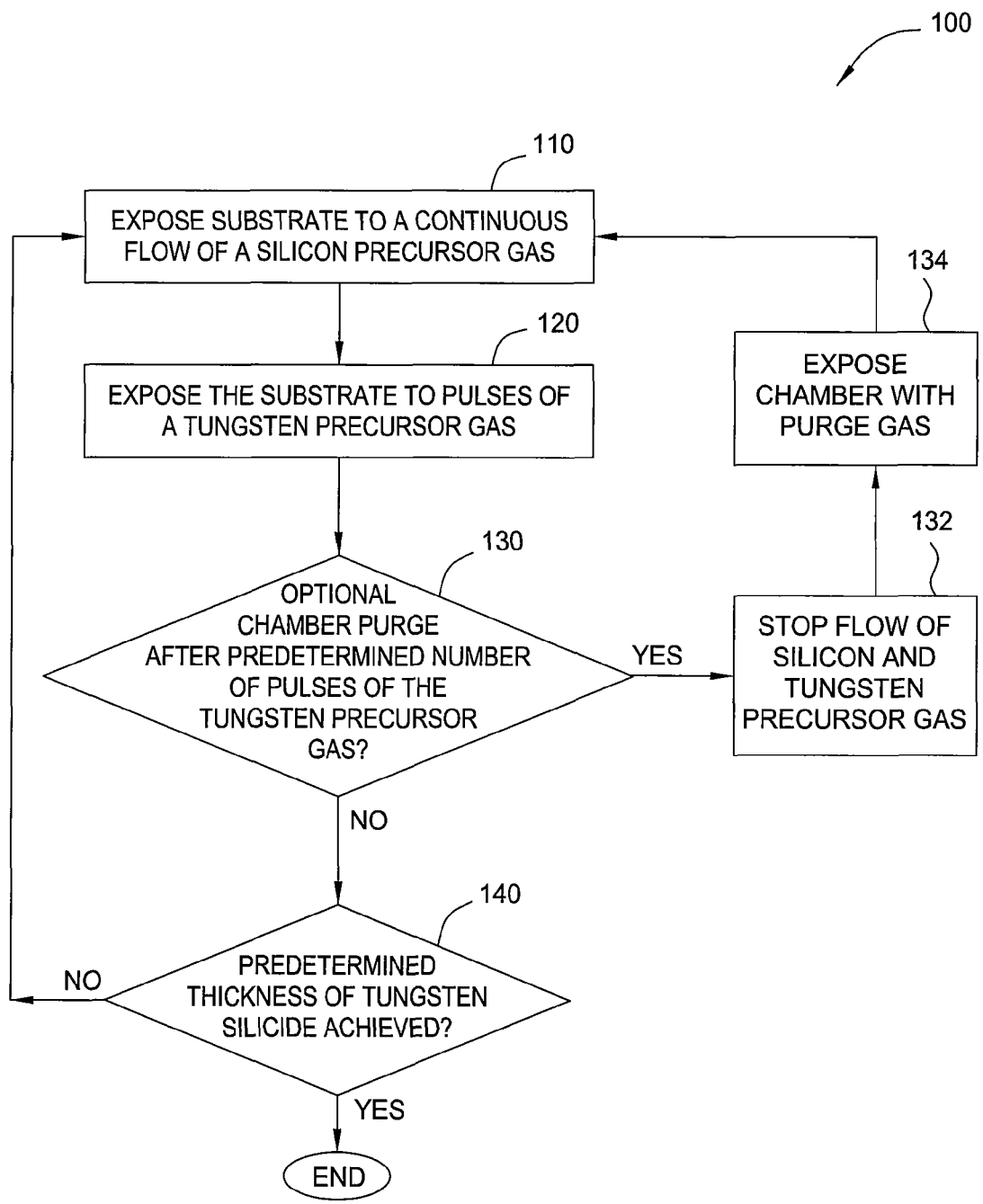
FIG. 1 illustrates a flow chart depicting a process sequence for forming a tungsten silicide layer using a vapor deposition technique according to an embodiment described herein.

FIG. 1 illustrates an exemplary process 100 for forming a tungsten silicide material according to one embodiment of the invention. A substrate to be processed is first exposed to a continuous flow of a silicon precursor gas (step 110). Pulses of a tungsten precursor gas are intermittently exposed to the substrate while flowing the silicon precursor gas (step 120). The tungsten precursor gas and the silicon precursor gas may be introduced together or independently into the processing chamber. When the tungsten precursor gas is on, that is, both the tungsten and the silicon precursor gases are flowing into the processing chamber, the substrate may be exposed to the tungsten precursor gas for a first time period within a range from about 0.05 seconds to about 5 seconds, preferably, from about 0.1 seconds to about 2 seconds, and more preferably, from about 0.2 seconds to about 1 second, for example, about 0.5 seconds. Between each pulse of tungsten precursor gas, when the tungsten precursor gas is off and the flow of the silicon precursor gas is kept on, the substrate is exposed to the silicon precursor gas for another or second time period within a range from about 0.05 seconds to about 5 seconds, preferably, from about 0.1 seconds to about 2 seconds, and more preferably, from about 0.2 seconds to about 1 second, for example, about 1 second. When the tungsten precursor gas is off between cycles, the silicon precursor gas may be used as a purge gas which purges or otherwise removes any residual tungsten-containing precursor or by-products. Alternatively, a carrier gas may be co-flowed with the silicon precursor gas and/or the tungsten precursor gas. Suitable carrier gases include argon, nitrogen, hydrogen, or combinations thereof.

Referring to step 130, after each deposition cycle (steps 110 and 120), the processing chamber may be optionally exposed to a purge step after a predetermined number of pulses of the tungsten precursor gas. The processing chamber may be partially or substantially evacuated, flushed with a purge gas, or both. The purge gas may include argon, nitrogen, hydrogen, or combinations thereof. In step 132, the flow of the silicon precursor gas and the tungsten precursor gas may be stopped and the processing chamber may be exposed to the purge gas in step 134. A throttle valve may be used to control the internal pressure of the processing chamber. The processing chamber is usually evacuated to remove gases therein, prior to, during, or after flowing the purge gas into the processing chamber. In one example, the flow of the silicon precursor gas may be stopped before the flow of the tungsten precursor gas. In another example, the flow of the tungsten precursor gas may be stopped before the flow of the silicon precursor gas. After the purge step, the deposition cycle (steps 110 and 120) is repeated until a desired thickness of the tungsten silicide material is achieved, per step 140. The option to conduct or repeat step 130 is also provided upon repeating the deposition cycle.

In step 140, after each deposition cycle (steps 110 and 120), a tungsten silicide layer having a predetermined thickness will be deposited on the substrate. In one example, each deposition cycle may form a layer of tungsten silicide material having a thickness within a range from about 10 Å to about 12 Å. Depending on specific device requirements, subsequent deposition cycles may be performed to deposit tungsten silicide layer having a predetermined desired thickness. As such, the deposition cycle (steps 110 and 120) may be repeated to form the tungsten silicide material having the desired thickness. The tungsten silicide material may be deposited to a thickness within a range from about 50 Å to about 200 Å. Thereafter, process 100 may be stopped upon achieving the desired thickness.

In process 100, during the vapor deposition of the tungsten silicide layer, the substrate may be heated before exposing to the silicon precursor gas or during steps 110 or 120. Prior to or during process 100, the substrate may be heated to a process temperature within a range from about 200° C. to about 500° C., preferably, from about 300° C. to about 450° C., and more preferably, from about 350° C. to about 400° C., such as about 380° C. In one example, the temperature of the substrate may be maintained for the subsequent vapor deposition process. Process 100 is typically performed in a processing chamber having a internal pressure of about 760 Torr or less, preferably, within a range from about 0.1 Torr to about 100 Torr, more preferably, from about 1 Torr to about 50 Torr, and more preferably, from about 2 Torr to about 10 Torr. In some examples, the internal pressure of the processing chamber may be within a range from about 5 Torr to about 10 Torr. The deposition process usually lasts for a time period within a range from about 1 second to about 90 seconds. In one example, the deposition process lasts for about 60 seconds or less. In another example, the deposition process lasts for about 30 seconds or less. In another example, deposition the process lasts for about 10 seconds.

Steps 110 and 120 provide a continuous flow of the silicon precursor gas into the processing chamber whereas the tungsten precursor gas is intermittently pulsed or added into the processing chamber. The tungsten precursor gas may be intermittently pulsed or added into a stream of carrier gas and/or the continuous stream of the silicon precursor gas or directly into the processing chamber. Regardless, the substrate is exposed to intermittent pulses of the tungsten precursor gas. Each processing step (steps 110 and 120) lasts within a range from about 0.01 seconds to about 10 seconds, preferably, from about 0.1 seconds to about 5 seconds. The substrate may be exposed to the silicon precursor gas and the tungsten precursor gas having a silicon/tungsten precursor flow rate ratio of greater than 1. In some examples, the silicon/tungsten precursor flow rate ratio is about 2:1 or greater, such as about 3:1 or greater, about 4:1 or greater, about 5:1 or greater, or even about 10:1 or greater.

In one embodiment, the silicon precursor gas may have a flow rate within a range from about 50 sccm to about 300 sccm, preferably, from about 80 sccm to about 200 sccm, more preferably, from about 100 sccm to about 150 sccm. The tungsten precursor gas may have a flow rate within a range from about 10 sccm to about 200 sccm, preferably, from about 30 sccm to about 100 sccm, more preferably, from about 50 sccm to about 80 sccm. The precursor gases, such as the tungsten and/or silicon precursor gases, may be introduced into the processing chamber with or without a carrier gas. The carrier gas may have a flow rate within a range from about 50 sccm to about 4,000 sccm, for example, about 3,600 sccm.

In one example, the silicon precursor gas may have a flow rate of about 60 sccm and the tungsten precursor gas may have a flow rate of about 50 sccm, therefore the silicon/tungsten precursor flow rate ratio is greater than 1, such as about 1.2. In another example, the silicon precursor gas may have a flow rate of about 90 sccm and the tungsten precursor gas may have a flow rate of about 60 sccm, therefore the silicon/tungsten precursor flow rate ratio is greater than 1, such as about 1.5. In another example, the silicon precursor gas may have a flow rate of about 120 sccm and the tungsten precursor gas may have a flow rate of about 60 sccm, therefore the silicon/tungsten precursor flow rate ratio is about 2. In another example, the silicon precursor gas may have a flow rate of about 150 sccm and the tungsten precursor gas may have a flow rate of about 50 sccm, therefore the silicon/tungsten precursor flow rate ratio is about 3. In another example, the silicon precursor gas may have a flow rate of about 200 sccm and the tungsten precursor gas may have a flow rate of about 50 sccm, therefore the silicon/tungsten precursor flow rate ratio is about 4.

A vapor deposition processing chamber used during embodiments described herein is available from Applied Materials, Inc., located in Santa Clara, Calif. Software routines are executed to initiate process recipes or sequences. The software routines, when executed, transform the general purpose computer into a specific process computer that controls the chamber operation so that a chamber process is performed during the deposition process. For example, software routines may be used to precisely control the activation of the electronic control valves for the execution of process sequences according to some embodiments of the invention. Alternatively, the software routines may be performed in hardware, as an application specific integrated circuit or other types of hardware implementation, or a combination of software or hardware.

Figure 2:
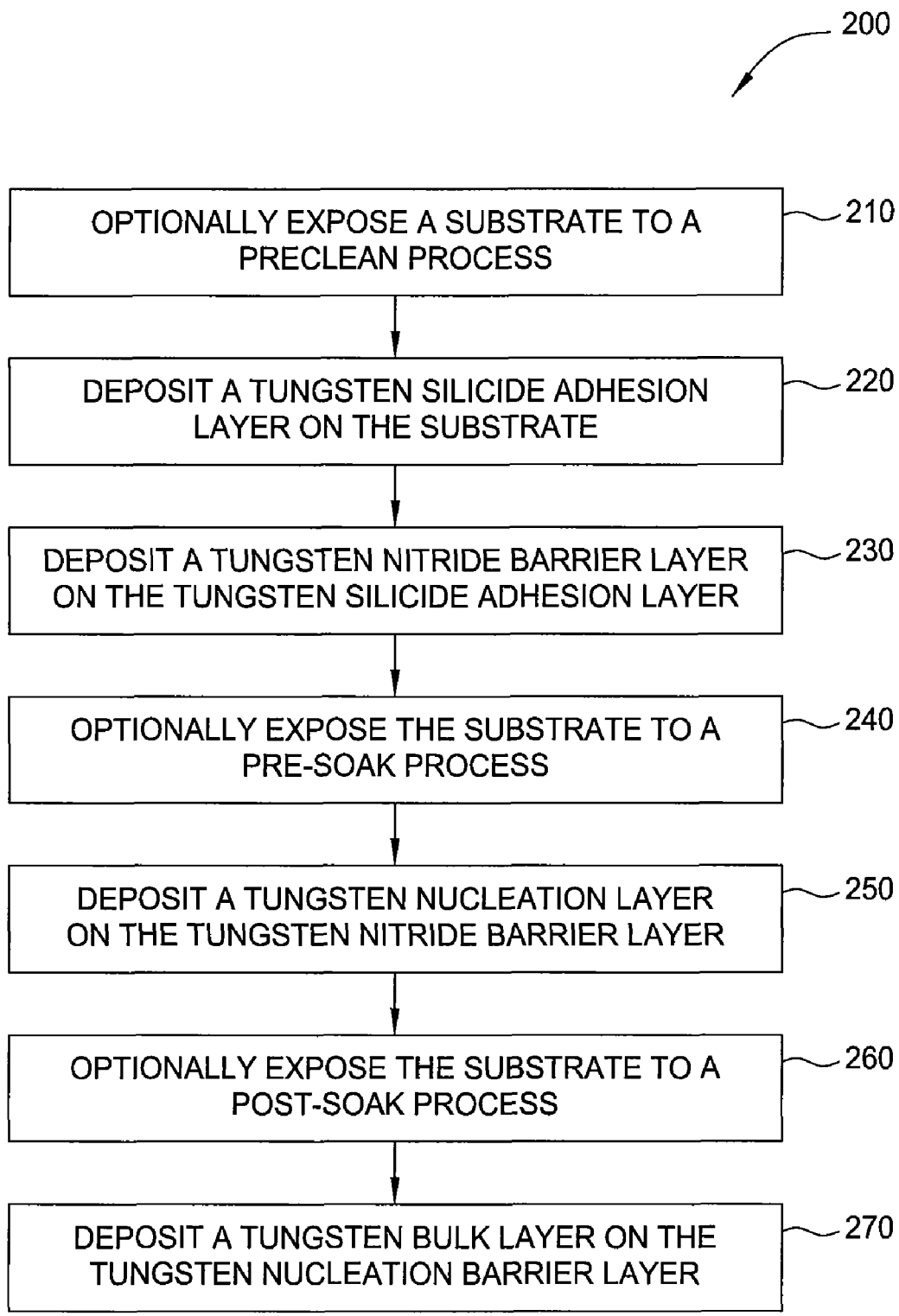
FIG. 2 illustrates a flow chart depicting a process sequence for the forming of a tungsten-containing material according to another embodiment described herein.

FIG. 2 illustrates process 200 for the forming of a tungsten-containing material according to another embodiment described herein. During step 210, the substrate may be optionally exposed to a pre-clean process. The substrate usually contains a silicon containing surface (e.g., silicide) disposed thereon and is exposed to a vapor deposition process during step 220. In one example the vapor deposition process includes exposing the substrate to a continuous flow of a silicon precursor gas and intermittent pulses of a tungsten precursor gas while depositing a tungsten silicide layer onto the substrate. During step 230, a tungsten nitride barrier layer is deposited on or over the substrate containing the tungsten silicide layer. In another example, the tungsten nitride barrier layer may be deposited by an ALD process. Optionally, the substrate containing the tungsten nitride barrier layer may be exposed to a pre-soak process or a first soak process in step 240. The soak process includes delivering pre-soak gas or a reducing gas containing a reductant or a reducing agent into the processing chamber. In another example, the substrate surface forms another treated layer, such as a reduced barrier layer.

In step 250, a nucleation layer (e.g., tungsten) is deposited on or over the substrate containing the barrier layer. Generally, the nucleation layer may be deposited by a vapor deposition process that includes PVD, ALD, CVD, or pulsed-CVD. In step 260, optionally, the substrate containing the nucleation layer may be exposed to post-soak process or a second soak process with the same or a different reductant as used in step 240. Thereafter, a bulk layer (e.g., tungsten) is deposited on the nucleation layer during step 270. The bulk layer may be deposited by a CVD process.

During step 210, the substrate may be exposed to a pre-clean process. The substrate usually contains silicon, polysilicon, or silicon containing surface (e.g., silicide) disposed thereon and may be exposed to pre-clean solution, vapor, or plasma during a pre-clean process. In one embodiment, the substrate is exposed to a reducing agent in gaseous form, such as silane, disilane, diborane, hydrogen, phosphine, or derivatives thereof. A carrier gas may be co-flowed with the reducing agent. Carrier gases include hydrogen, nitrogen, argon, or combinations thereof. In another embodiment, the substrate is exposed to a plasma pre-clean process. The plasma may be generated internal (e.g., in situ plasma) or generated externally (e.g., remote plasma system). The substrate may be exposed to a plasma formed from a gas or a gaseous mixture containing argon, helium, neon, hydrogen, nitrogen, ammonia, silane, disilane, diborane, or mixtures thereof. In several examples, the plasma may be formed from a hydrogen and ammonia mixture, a hydrogen and nitrogen mixture, or a nitrogen and ammonia mixture.

During step 220, a tungsten silicide material may be deposited on or over the substrate by a vapor deposition process subsequent the optional pre-clean process. In one embodiment, the tungsten suicide material may be deposited by process 100, as described herein. The substrate surface is exposed to a continuous flow of silicon precursor gas and intermittent pulses of tungsten precursor gas while a tungsten silicide layer is deposited onto the substrate. In one example, the silicon precursor gas contains silane and may be introduced into the processing chamber with a flow rate of about 120 sccm, while the tungsten precursor gas contains tungsten hexafluoride and may be introduced into the processing chamber with a flow rate of about 60 sccm. In another embodiment, the tungsten silicide material may be deposited by other ALD or CVD processes.

During step 230, a tungsten nitride barrier layer may be disposed on or over the tungsten silicide layer. In one embodiment, the tungsten nitride barrier layer may contain one or multiple layers. Each of the layers of the tungsten nitride barrier layer may contain metallic tungsten, tungsten nitride, tungsten silicide nitride, tungsten boride, nitride, derivatives thereof, alloys thereof, or combinations thereof. In one example, the tungsten nitride barrier layer may be deposited by an ALD process. The tungsten nitride barrier layer may be deposited to a thickness of at least about 30 Å, such as within a range from about 30 Å to about 100 Å, preferably, about 60 Å. In one example, a tungsten nitride barrier layer is deposited on or over the tungsten silicide layer by an ALD process by sequentially pulsing tungsten precursor gas and a nitrogen precursor gas into the processing chamber to expose the substrate surface. The tungsten precursor gas may contain tungsten hexafluoride and may be introduced into the processing chamber at a rate of about 60 sccm. The nitrogen precursor gas may contain ammonia and may be introduced into the processing chamber at a rate at a rate of about 200 sccm. The purge gas may contain silane or hydrogen and be introduced into the processing chamber at a rate of about 1,000 sccm. The tungsten precursor gas may contain a carrier gas, such as argon or nitrogen, having a flow rate of about 4,000 sccm.

The process conditions, such as temperature and pressure, set during step 220 may be used or altered during step 230. In one embodiment, the processing chamber is adjusted to heat the substrate at a process temperature within a range from about 200° C. to about 500° C., preferably, from about 300° C. to about 450° C., and more preferably, from about 350° C. to about 400° C., for example, about 380° C., during the steps 220 and 230. The processing chamber may have an internal pressure of about 760 Torr or less, preferably, within a range from about 0.1 Torr to about 100 Torr, more preferably, from about 1 Torr to about 50 Torr, and more preferably, from about 2 Torr to about 10 Torr. In one example, the processing chamber used during the pre-clean process may be the same processing chamber as used to deposit the layer and the barrier layer. In another example, the processing chamber used during the deposition of the tungsten silicide material and the barrier layer may be the same processing chamber as used to deposit subsequent soak process and nucleation layer during steps 240, 250, and 260.

During step 240, the substrate surface may be optionally exposed to a reducing gas containing a reductant and an optional carrier gas during the pre-soak process. The pre-soak process is generally a thermal process, but may be a plasma process. The reductant adsorbs and/or reacts to the substrate surface containing the barrier layer to form a treated surface. The treated surface provides a quicker deposition process for a subsequently deposited material. The reductants may include silane compounds, borane compounds, phosphine compounds, ammonia, amine compounds, hydrogen, derivatives thereof, or combinations thereof. Silane compounds include silane, disilane, trisilane, tetrasilane, chlorosilane, dichlorosilane, tetrachlorosilane, hexachlorodisilane, or derivatives thereof, while borane compounds include borane, diborane, triborane, tetraborane, pentaborane, alkylboranes, such as triethylborane, or derivatives thereof. Some specific reductants include silane, disilane, diborane, hydrogen, derivatives thereof, or combinations thereof. A carrier gas may be co-flowed with the reductant. Carrier gases include hydrogen, nitrogen, argon, helium, or combinations thereof.

The substrate may be exposed to the pre-soak gas or reducing gas during the pre-soak process in step 240 for a time period within a range from about 1 second to about 90 seconds, preferably, from about 5 seconds to about 60 seconds, more preferably, from about 10 seconds to about 30 seconds, and more preferably, from about 15 seconds to about 20 seconds. The barrier layer on the substrate surface may be exposed to a pre-soak gas while the substrate is heated to a temperature within a range from about 100° C. to about 600° C., preferably, from about 200° C. to about 600° C., more preferably, from about 300° C. to about 500° C., more preferably, from about 350° C. to about 420° C., and more preferably, from about 375° C. to about 500° C. during the pre-soak process. The processing chamber may have internal pressure within a range from about 0.1 Torr to about 150 Torr, preferably, from about 1 Torr to about 100 Torr, more preferably, from about 10 Torr to about 50 Torr, and more preferably, from about 20 Torr to about 40 Torr. The barrier layer disposed on or over the substrate may be reduced and/or adsorbs the reductant to form a conditioned layer for the subsequent nucleation layer.

During step 250, a nucleation layer is deposited on or over the substrate surface containing the tungsten nitride barrier layer. The nucleation layer may be deposited by a vapor deposition process such as ALD, CVD, and/or pulsed-CVD. The processing chamber used to deposit the nucleation layer may be the same processing chamber used in the soak processes as described in steps 240 and 260. The nucleation layer may contain metallic tungsten, tungsten boride, tungsten silicide, other tungsten alloys, derivatives thereof, or combinations thereof.

The nucleation layer is typically deposited to a thickness within a range from about 2 Å to about 200 Å. In one example, a nucleation layer having a thickness within a range from about 2 Å to about 50 Å, such as about 30 Å, is deposited on the substrate which is sequentially exposed to tungsten hexafluoride and reducing agent (e.g., silane or diborane) during an ALD process. In another example, a nucleation layer having a thickness within a range from about 2 Å to about 200 Å, such as about 50 Å, is deposited on the substrate which is simultaneously exposed to tungsten hexafluoride and reducing agent (e.g., silane or diborane) during a pulsed-CVD process.

During step 260, the substrate surface may be optionally exposed to another or second reducing gas containing a reductant and an optional carrier gas during the post-soak process. The post-soak process is generally a thermal process, but may be a plasma process. The reductant adsorbs and/or reacts to the substrate surface containing the nucleation layer to form a treated surface. The treated surface provides a quicker deposition process for a subsequently deposited material. The reductants may include silane compounds, borane compounds, phosphine compounds, ammonia, amine compounds, hydrogen, derivatives thereof, or combinations thereof. Silane compounds include silane, disilane, trisilane, tetrasilane, chlorosilane, dichlorosilane, tetrachlorosilane, hexachlorodisilane, or derivatives thereof, while borane compounds include borane, diborane, triborane, tetraborane, pentaborane, alkylboranes, such as triethylborane, or derivatives thereof. Some specific reductants include silane, disilane, diborane, hydrogen, derivatives thereof, or combinations thereof. A carrier gas may be co-flowed with the reductant. Carrier gases include hydrogen, nitrogen, argon, helium, or combinations thereof.

The substrate containing the nucleation layer may be exposed to the post-soak gas or reducing gas during the post-soak process in step 260 for a time period within a range from about 1 second to about 90 seconds, preferably, from about 5 seconds to about 60 seconds, more preferably, from about 10 seconds to about 30 seconds, and more preferably, from about 15 seconds to about 20 seconds. The nucleation layer on the substrate surface may be exposed to a post-soak gas while the substrate is heated to a temperature within a range from about 100° C. to about 600° C., preferably, from about 200° C. to about 600° C., more preferably, from about 300° C. to about 500° C., more preferably, from about 350° C. to about 420° C., and more preferably, from about 375° C. to about 500° C. during the post-soak process. The processing chamber may have internal pressure within a range from about 0.1 Torr to about 150 Torr, preferably, from about 1 Torr to about 100 Torr, more preferably, from about 10 Torr to about 50 Torr, and more preferably, from about 20 Torr to about 40 Torr. The nucleation layer disposed on or over the substrate may be reduced and/or adsorbs the reductant to form a conditioned layer for the subsequent bulk layer.

During step 270, a bulk layer may be deposited on or over the substrate surface containing the nucleation layer. The bulk layer may be deposited by a vapor deposition process that includes CVD or pulsed-CVD. The processing chamber used to deposit the bulk layer may be the same processing chamber used in the post-soak process as described in step 260. The bulk layer may contain metallic tungsten, tungsten alloys, tungsten-containing materials (e.g., tungsten boride, tungsten silicide, or tungsten phosphide), or combinations thereof.

In one example, t a tungsten bulk layer may be deposited on or over the nucleation layer on the substrate which is simultaneously exposed to tungsten hexafluoride and hydrogen gas during a CVD process. In another example, a PVD process utilizing a tungsten source is used to deposit a bulk layer on or over the nucleation layer. Processes for soaking a tungsten nucleation layer and depositing a tungsten bulk layer thereon are further described in the commonly assigned U.S. Pat. No. 6,156,382, which is incorporated herein by reference.

Process Integration

A tungsten-containing layer and barrier layer as described above has shown particular utility when integrated with traditional nucleation fill techniques to form features with excellent film properties. An integration scheme can include ALD, CVD, pulsed-CVD processes, or combinations thereof, to deposit tungsten-containing layer and barrier layer while a nucleation layer may be deposited by ALD process. Integrated processing systems capable of performing such an integration scheme include ENDURA®, ENDURA SL®, CENTURA®, or PRODUCER® processing systems, each available from Applied Materials, Inc., located in Santa Clara, Calif. Any of these systems may be configured to include at least one ALD chamber for depositing the tungsten-containing layer and barrier layer, at least one ALD or pulsed-CVD chamber for depositing the nucleation layer, at least one CVD chamber for depositing bulk fill, and/or at least one PVD chamber for additional materials. In one embodiment, one ALD or CVD chamber may be configured to perform all vapor deposition processes related to the tungsten-containing layers.

Figure 3A:
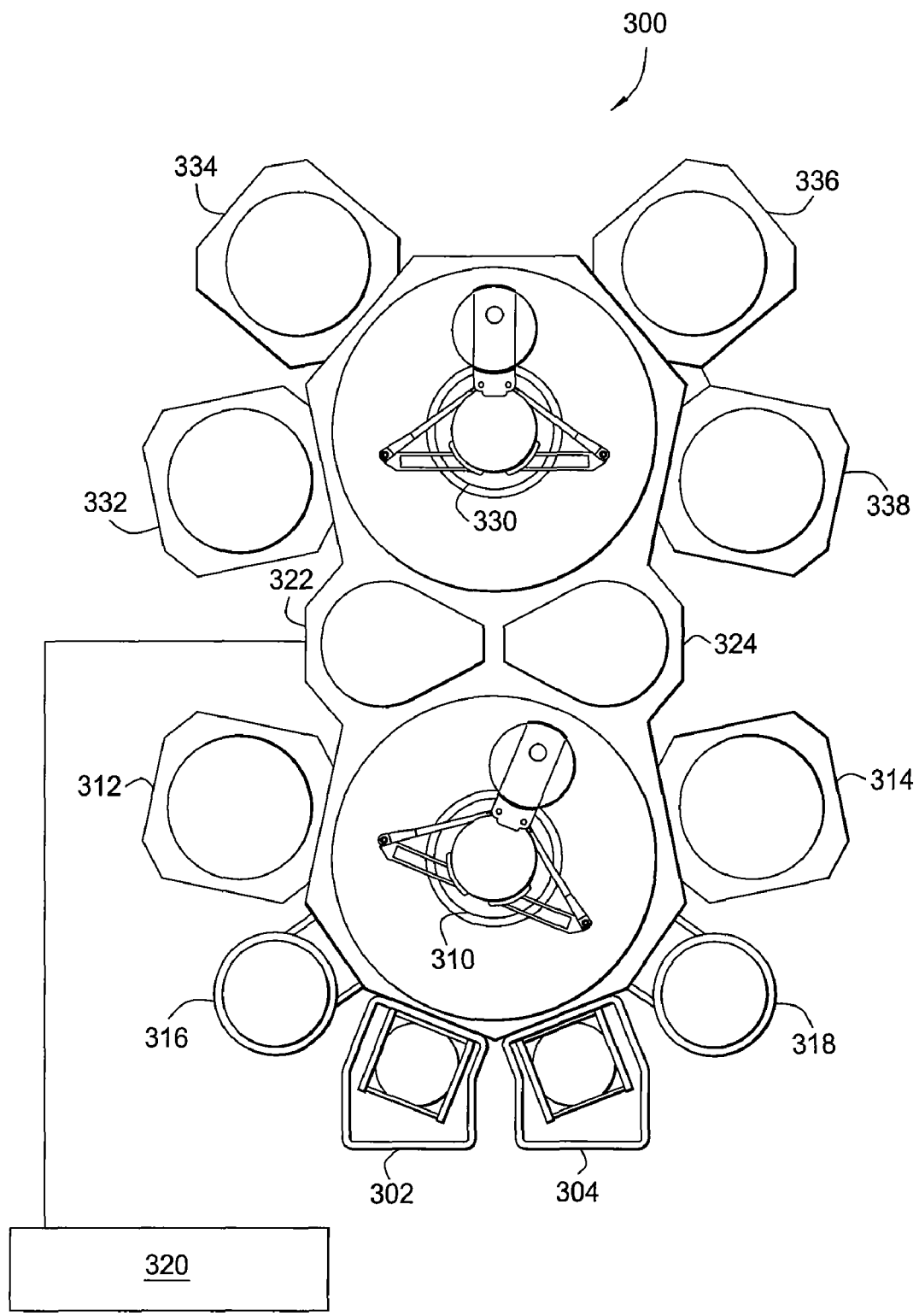
FIGS. 3A-3B depict an exemplary integrated processing platforms that may be used during process described herein.

FIG. 3A depicts a schematic top-view diagram of an exemplary multi-chamber processing system 300. A similar multi-chamber processing system is disclosed in commonly assigned U.S. Pat. No. 5,186,718, which is incorporated by reference herein. Processing system 300 generally includes load lock chambers 302 and 304 for the transfer of substrates into and out from processing system 300. Typically, since processing system 300 is under vacuum, load lock chambers 302 and 304 may "pump down" the substrates introduced into processing system 300. First robot 310 may transfer the substrates between load lock chambers 302 and 304, and a first set of one or more substrate processing chambers 312, 314, 316, and 318 (four are shown). Each processing chamber 312, 314, 316, and 318, may be outfitted to perform a number of substrate processing operations such as ALD, CVD, PVD, etch, pre-clean, de-gas, orientation, or other substrate processes. First robot 310 also transfers substrates to/from one or more transfer chambers 322 and 324.

Transfer chambers 322 and 324 are used to maintain ultra-high vacuum conditions while allowing substrates to be transferred within processing system 300. Second robot 330 may transfer the substrates between transfer chambers 322 and 324 and a second set of one or more processing chambers 332, 334, 336, and 338. Similar to processing chambers 312, 314, 316, and 318, processing chambers 332, 334, 336, and 338 may be outfitted to perform a variety of substrate processing operations, such as ALD, CVD, PVD, etch, pre-clean, de-gas, or orientation. Any of processing chambers 312, 314, 316, 318, 332, 334, 336, and 338 may be removed from processing system 300 if not necessary for a particular process to be performed by processing system 300. Microprocessor controller 320 may be used to operate all aspects of processing system 300.

In one arrangement, each processing chamber 332 and 338 may be an ALD chamber or other vapor deposition chamber adapted to deposit sequential layers containing different chemical compound. For example, the sequential layers may include a layer, a barrier layer, and a nucleation layer. Processing chambers 334 and 336 may be an ALD chamber, a CVD chamber, or a PVD adapted to form a bulk layer. Processing chambers 312 and 314 may be a PVD chamber, a CVD chamber, or an ALD chamber adapted to deposit a dielectric layer. Also, processing chambers 316 and 318 may be an etch chamber outfitted to etch apertures or openings for interconnect features. This one particular arrangement of processing system 300 is provided to illustrate some embodiments of the invention and should not be used to limit the scope of other embodiments of the invention.

In another integration scheme, one or more ALD chambers are integrated onto a first processing system while one or more bulk layer deposition chambers are integrated onto a second processing system. In this configuration, substrates are first processed in the first system where a layer, a barrier layer and a nucleation layer is deposited on a substrate sequentially. Thereafter, the substrates are moved to the second processing system where bulk deposition occurs.

In yet another integrated system, a system may include nucleation deposition as well as bulk fill deposition in a single chamber. A chamber configured to operate in both an ALD mode as well as a conventional CVD mode may be used in processes described herein. One example of such a chamber is described in commonly assigned U.S. Pat. No. 6,878,206, which is incorporated herein by reference.

Figure 3B:
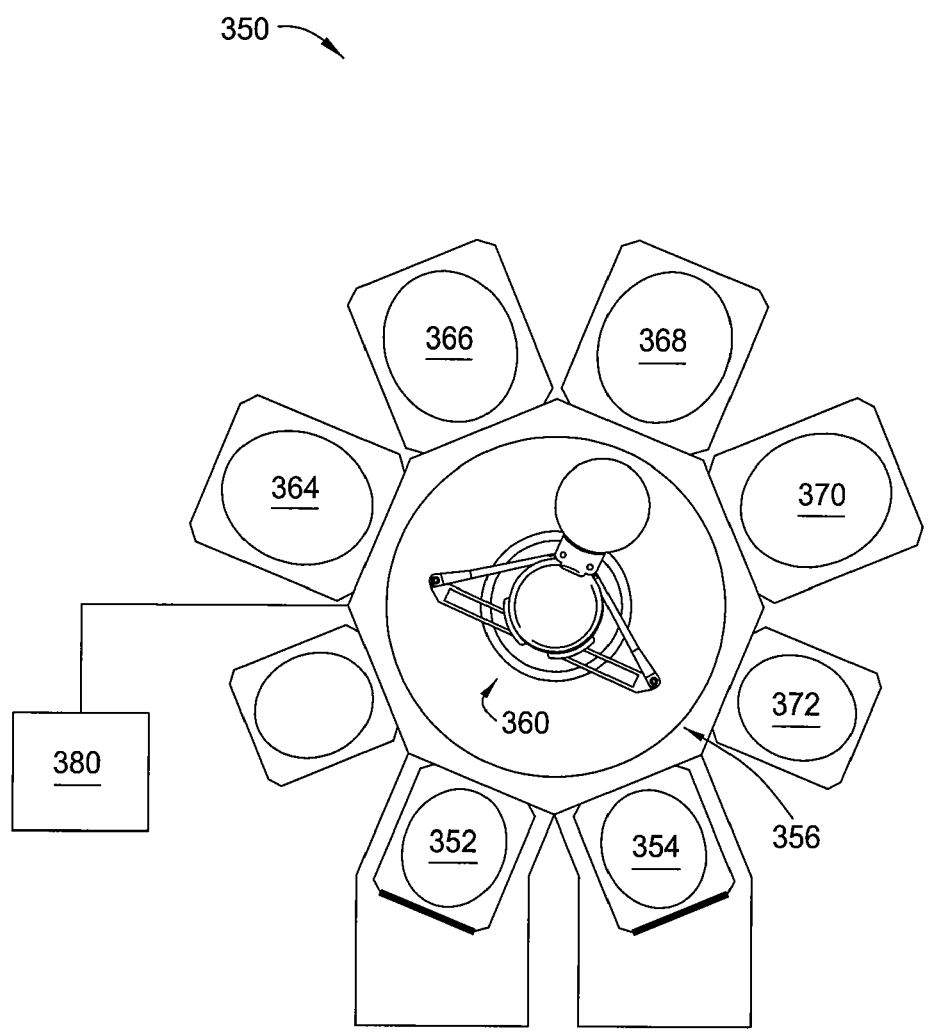

In FIG. 3B, the multi-chamber processing system 350 generally includes load lock chambers 352, 354 for the transfer of substrates into and out from processing system 350. Typically, since processing system 350 is under vacuum, load lock chambers 352, 354 may "pump down" the substrates introduced into processing system 350. Robot 360 may transfer the substrates between load lock chambers 352, 354, and processing chambers 364, 366, 368, 370, and 372. Each processing chamber 364, 366, 368, 370, and 372 may be outfitted to perform a number of substrate processing operations such as ALD, CVD, PVD, etch, pre-clean, de-gas, heat, orientation and other substrate processes. Robot 360 also transfers substrates to/from transfer chamber 356. Any of processing chambers 364, 366, 368, 370, and 372 may be removed from processing system 350 if not necessary for a particular process to be performed by processing system 350. Microprocessor controller 380 may be used to operate all aspects of processing system 350.

In one arrangement, each processing chamber 364 and 370 may be an ALD chamber adapted to deposit a nucleation layer, each processing chamber 366 and 368 may be an ALD chamber, a CVD chamber or a PVD chamber adapted to form a bulk fill deposition layer.

In another arrangement, the aforementioned sequential layers may all be deposited in each of processing chamber 364, 366, 368, 370, and 372 as each chamber may be outfitted to perform a number of substrate processing operations such as ALD, CVD, PVD, etch, pre-clean, de-gas, heat, orientation and other substrate processes. The sequential layers may include a layer, a barrier layer, a nucleation layer, and a bulk layer. The different arrangement of processing system 350 mentioned here is provided to illustrate the invention and should not be used to limit the scope of the embodiments herein.

Regardless of the integration scheme, the layer may have a thickness within a range from about 1 Å to about 10 Å, for example, from about 5 Å to about 10 Å. The barrier layer is usually deposited to a thickness of at least about 30 Å, such as within a range from about 30 Å to about 100 Å, preferably, at about 60 Å. The nucleation layer may have a thickness within a range from about 2 Å to about 200 Å, for example, from about 5 Å to about 100 Å and the bulk layer may have a thickness within a range from about 100 Å to about 10,000 Å, for example, from about 1,000 Å to about 5,000 Å. However, the thickness of these films can vary depending on the feature sizes and aspect ratios of a given application. Accordingly, the films are suitably sized to accommodate the geometries of a given application. The following are some exemplary geometries and applications that may benefit from a nucleation layer deposited according to embodiments described herein.

Figure 4A:
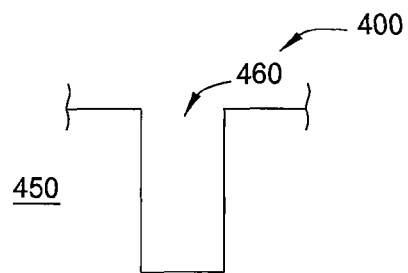
FIGS. 4A-4E depicts a cross sectional view of a substrate during various stages of a process, according to another embodiment described herein.
Figure 4B:
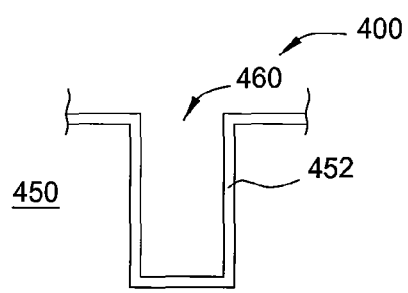
Figure 4C:
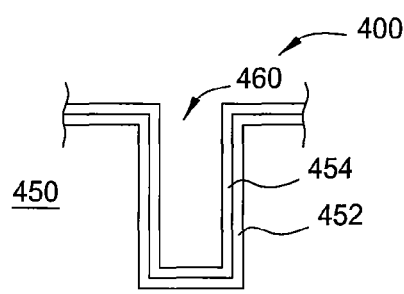

FIGS. 4A-4E show cross sectional views of a semiconductor feature that one embodiment of the process is utilized to fill via 460. In FIG. 4A, substrate 400 includes at least one via 460 formed within substrate surface 450. The substrate surface 450 may be a silicon containing surface. In FIG. 4B, an adhesion layer 452 (e.g. a suicide layer) may be deposited by exposing the substrate to a continuous flow of a silicon precursor gas, and exposing the substrate to pulses of a tungsten precursor gas to the substrate surface 450. Then, barrier layer 454 may be deposited by ALD, CVD, or PVD techniques onto adhesion layer 452 and substrate 400 with via 460 in FIG. 4C. Adhesion layer 452 and barrier layer 454 may contain metallic tungsten, tungsten nitride, tungsten boride, tungsten boride nitride, tungsten silicide, tungsten silicide nitride, tungsten phosphide, derivatives thereof, alloys thereof, or combinations thereof. In one example, adhesion layer 452 may contain metallic tungsten, tungsten silicide, tungsten boride, or alloys thereof. In another example, barrier layer 454 may contain tungsten nitride, tungsten silicide nitride, tungsten boride nitride, or alloys thereof.

Figure 4D:
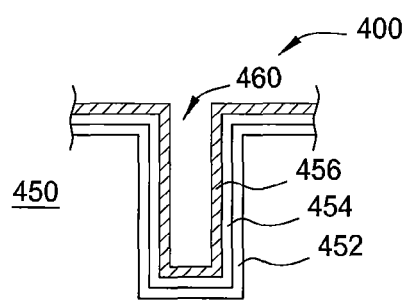
Figure 4E:
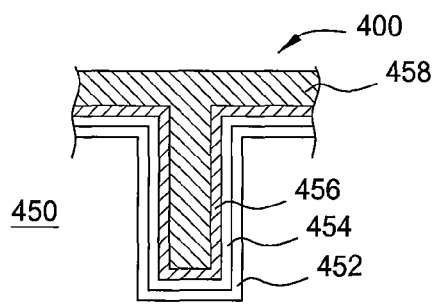

Prior to the nucleation of a tungsten nitride barrier layer, as depicted in FIG. 4D, a soak process may be administered to barrier layer 454. The soak process renders the sidewalls, of barrier layer 454 within via 460, to adhere and grow tungsten nucleation layer 456 at about the same rate as barrier layer 454 outside via 460. When the soak process is omitted, growth of tungsten nucleation layer 456 on the sidewalls is not constant with respect to the growth of tungsten nucleation layer 456 outside via 460. Once the tungsten nucleation layer 456 has been deposited, then a secondary soak or post-soak process is conducted to treat tungsten bulk layer 458. The post-soak process provides tungsten bulk layer 458 to more smoothly continue growth while filling via 460, as demonstrated in FIG. 4E.

Figure 5:
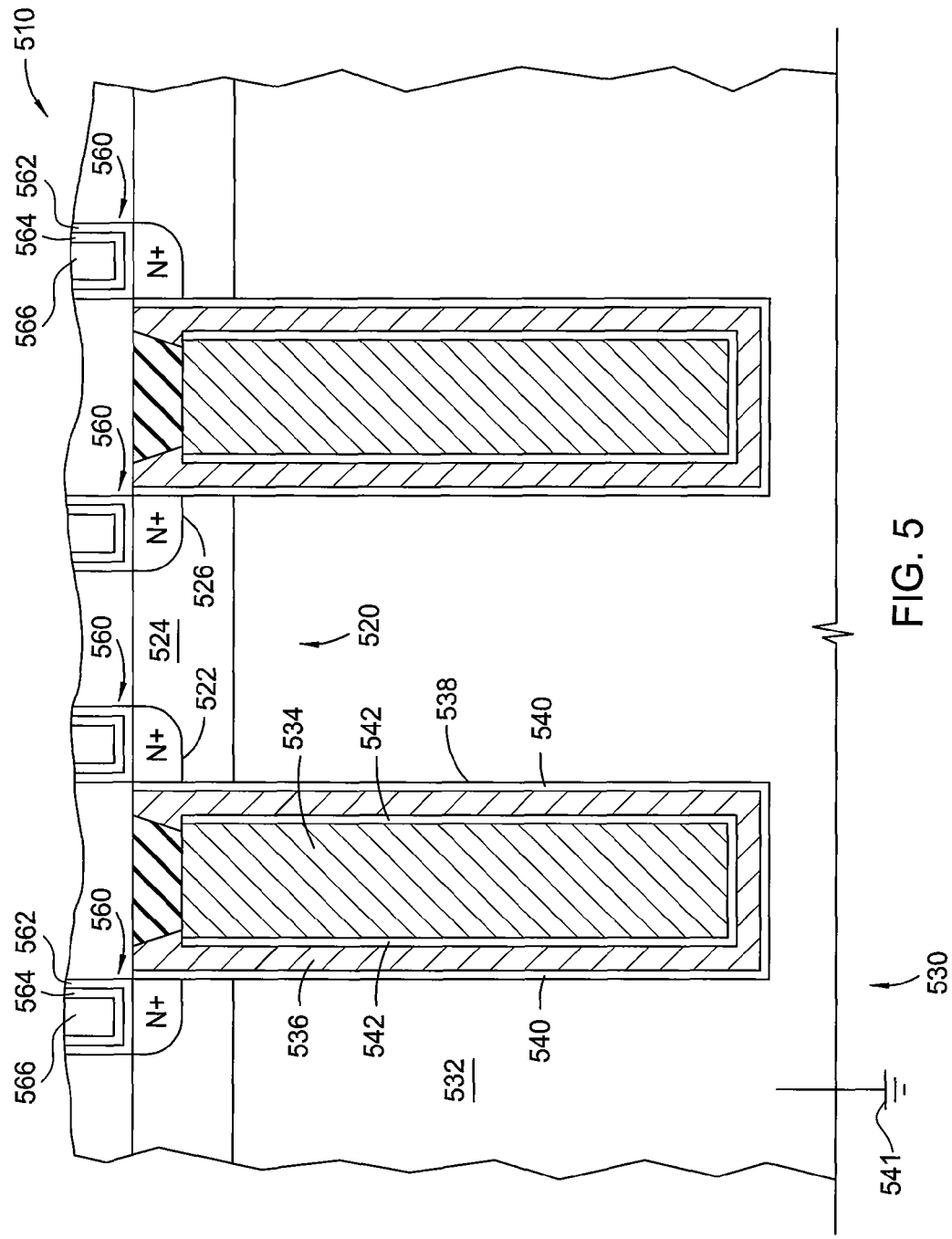
FIG. 5 depicts a cross sectional view of a conventional DRAM device formed according to an embodiment of the invention.

FIG. 5 is a cross sectional view of a conventional DRAM device having access transistor 520 positioned adjacent a top portion of trench capacitor 530. Access transistor 520 for DRAM device 510 is positioned adjacent a top portion of trench capacitor 530. Preferably, access transistor 520 contains a n-p-n transistor having source region 522, gate region 524, and drain region 526. Gate region 524 is a P$^-$ doped silicon epi-layer disposed over the P$^+$ substrate. Source region 522 of access transistor 520 is a N$^+$ doped material disposed on a first side of gate region 524 and drain region 526 is a N$^+$ doped material disposed on a second side of gate region 524, opposite source region 522.

Source and drain regions 522 and 524 may be connected to tungsten plug 560. Each tungsten plug 560 includes tungsten-containing material layer 562, tungsten nucleation layer 564, and tungsten bulk fill 566. The tungsten-containing material layer 562 may be a bi-layer stack comprising vapor deposited tungsten silicide followed by ALD deposited tungsten nitride. Tungsten nucleation layer 564 may be formed by using a soak process and an ALD process or a soak process and a pulsed-CVD process as described above. Tungsten bulk fill 566 may be deposited by using a post-soak process followed by a CVD process.

Trench capacitor 530 generally includes first electrode 532, second electrode 534 and dielectric material 536 disposed therebetween. The P$^+$ substrate serves as first electrode 532 of trench capacitor 530 and is connected to ground connection 541. Trench 538 is formed in the P$^+$ substrate and filled with a heavily doped N$^+$ polysilicon that serves as second electrode 534 of trench capacitor 530. Dielectric material 536 is disposed between first electrode 532 (e.g., P$^+$ substrate) and second electrode 534 (e.g., N$^+$ polysilicon). Tungsten-containing material layer 562 may be a bi-layer stack comprising vapor deposited tungsten silicide followed by ALD deposited tungsten nitride.

Trench capacitor 530 also includes a first layer containing tungsten liner 540 disposed between dielectric material 536 and first electrode 532. Tungsten liner 540 may be a bi-layer stack comprising tungsten silicide and tungsten nitride. Preferably, a second layer containing tungsten liner 542 is disposed between dielectric material 536 and second electrode 534. Alternatively, tungsten liners 540 and 542 are a combination film, such as metallic tungsten/titanium nitride.

Although the above-described DRAM device utilizes an n-p-n transistor, a P$^+$ substrate as a first electrode, and an N$^+$ polysilicon as a second electrode of the capacitor, other transistor designs and electrode materials are contemplated by the present invention to form DRAM devices. Additionally, other devices, such as crown capacitors for example, are contemplated by the present invention.

"Substrate surface" or "substrate," as used herein, refers to any substrate or material surface formed on a substrate upon which film processing is performed during a fabrication process. For example, a substrate surface on which processing may be performed include materials such as monocrystalline, polycrystalline or amorphous silicon, strained silicon, silicon on insulator (SOI), doped silicon, silicon germanium, germanium, gallium arsenide, glass, sapphire, silicon oxide, silicon nitride, silicon oxynitride, and/or carbon doped silicon oxides, for example, BLACK DIAMOND® low-k dielectric, available from Applied Materials, Inc., located in Santa Clara, Calif. Substrates may have various dimensions, such as 200 mm or 300 mm diameter wafers, as well as, rectangular or square panes, such as maybe used for LCDs or solar panel processing. Unless otherwise noted, embodiments and examples described herein are preferably conducted on substrates with a 200 mm diameter or a 300 mm diameter, more preferably, a 300 mm diameter. Embodiments of the processes described herein may be used to deposit metallic tungsten, tungsten nitride, tungsten boride, tungsten boride nitride, tungsten silicide, tungsten silicide nitride, tungsten phosphide, derivatives thereof, alloys thereof, combinations thereof, or other tungsten-containing materials on many substrates and surfaces, especially, on barrier layers, layers, or conductive layers. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, and patterned or non-patterned wafers. Substrates may be exposed to a pretreatment process to polish, etch, reduce, oxidize, hydroxylate, anneal, and/or bake the substrate surface.

"Atomic layer deposition" or "cyclical deposition" as used herein refers to the sequential introduction of two or more reactive compounds to deposit a layer of material on a substrate surface. The two, three or more reactive compounds may alternatively be introduced into a reaction zone of a processing chamber. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay a purge gas, such as argon or nitrogen, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. In alternative embodiments, the purge gas may also be a reducing agent, such as hydrogen, diborane, or silane. The reactive compounds are alternatively pulsed until a desired film or film thickness is formed on the substrate surface. In either scenario, the ALD process of pulsing compound A, purge gas, pulsing compound B and purge gas is an ALD cycle. A cycle can start with either compound A or compound B and continue the respective order of the cycle until achieving a film with the desired thickness. In another embodiment, a first precursor containing compound A, a second precursor containing compound B, and a third precursor containing compound C are each separately and alternatively pulsed into the processing chamber. Alternatively, a first precursor containing compound A and a second precursor containing compound B are each separately and alternatively pulsed into the processing chamber while, and a third precursor containing compound C is continuously flowed into the processing chamber. Alternatively, a pulse of a first precursor may overlap in time with a pulse of a second precursor while a pulse of a third precursor does not overlap in time with either pulse of the first and second precursors.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the processing chamber employed, the vacuum system coupled thereto, and the volatility/reactivity of the particular compound itself. A "half-reaction" as used herein to refer to a pulse of a precursor followed by a purge step.

EXAMPLES

The following hypothetical examples may be performed by depositing a tungsten suicide layer on a substrate (e.g., 300 mm diameter) using the vapor deposition processes described in embodiments herein. Subsequently, a tungsten nitride barrier layer may be deposited on or over the tungsten silicide layer by an ALD process using tungsten hexafluoride and ammonia. In some examples, the silane gas may contain a carrier gas such as argon, nitrogen, hydrogen, or combinations thereof.

Example 1

The substrate was placed into a deposition chamber and exposed to a vapor deposition process to form a tungsten silicide layer under the following conditions:
  Reagent: $SiH_4$ and $WF_6$;
  Pressure: about 5 Torr;
  Temperature: about 380° C.;
  Flow rates: about 120 sccm of $SiH_4$, and about 60 sccm of $WF_6$;
  Pulse durations of $WF_6$: about 0.5 seconds (on), about 0.5 seconds (off).

This vapor deposition cycle was continued until the tungsten silicide layer had a thickness of about 200 Å (about 30 cycles). Next, a tungsten nitride barrier layer was formed on the tungsten silicide layer in the deposition chamber using an ALD process under the following conditions:
  Reagent: $SiH_4$, $WF_6$, and $NH_3$;
  Pressure: about 5 Torr;
  Temperature: about 380° C.;
  Flow rates: about 200 sccm of $SiH_4$, about 60 sccm of $WF_6$, about 1,000 sccm of $NH_3$, and about 4,000 sccm of argon;
  Pulse duration: $SiH_4$ dose for about 1.5 seconds, $SiH_4$ purge for about 1.5 seconds, $WF_6$ dose for about 0.5 seconds, $WF_6$ purge for about 2.0 seconds, $NH_3$ dose for about 2.0 seconds, and $NH_3$ purge for about 2.0 seconds.

Next, a tungsten nucleation layer was formed on the tungsten nitride barrier layer in the deposition chamber using an ALD process under the following conditions:
  Reagents: $WF_6$, $SiH_4$, and argon;
  Pressure: about 5 Torr;
  Temperature: about 400° C.;
  Flow rates: about 60 sccm of $WF_6$, about 100 sccm of 5% $SiH_4$ in argon, and about 6,000 sccm of argon;
  Pulse duration: $WF_6$ dose for about 0.5 seconds, $WF_6$ purge for about 2.0 seconds, $SiH_4$ dose for about 1.5 seconds, and $SiH_4$ purge for about 1.5 seconds.

The ALD process was continued until the nucleation layer had a thickness of about 25 Å. Thereafter, a bulk tungsten layer was deposited $WF_6$—$H_2$ to a thickness of about 500 Å on the second nucleation layer using a CVD process at about 400° C.

Example 2

The substrate was placed into a deposition chamber and exposed to a vapor deposition process to form a tungsten silicide layer under the following conditions:
  Reagent: $SiH_4$ and $WF_6$;
  Pressure: about 5 Torr;
  Temperature: about 380° C.;
  Flow rates: about 120 sccm of $SiH_4$, and about 60 sccm of $WF_6$;
  Pulse duration of $WF_6$: about 0.5 seconds (on), about 0.5 seconds (off).

Next, a tungsten nitride barrier layer was formed on the tungsten silicide layer in the deposition chamber using an ALD process under the following conditions:
  Reagent: $SiH_4$, $WF_6$, and $NH_3$;
  Pressure: about 5 Torr;
  Temperature: about 380° C.;
  Flow rates: about 200 sccm of $SiH_4$, about 60 sccm of $WF_6$, and about 1,000 sccm of $NH_3$;
  Pulse duration: $SiH_4$ dose for about 1.5 seconds, $SiH_4$ purge for about 1.5 seconds, $WF_6$ dose for about 0.5 seconds, $WF_6$ purge for about 2.0 seconds, $NH_3$ dose for about 2.0 seconds, and $NH_3$ purge for about 2.0 seconds.

Next, the substrate was placed into a deposition chamber and exposed to a soak process under the following conditions:
  Reagent: $SiH_4$;
  Pressure: about 90 Torr;
  Temperature: about 400° C.;
  Flow rates: about 200 sccm of $SiH_4$; and
  Duration: about 24 seconds.

Next, a tungsten nucleation layer was formed on the tungsten nitride barrier layer in the deposition chamber using an ALD process under the following conditions:
  Reagents: $WF_6$, $SiH_4$, and argon;
  Pressure: about 5 Torr;
  Temperature: about 400° C.;
  Flow rates: about 60 sccm of $WF_6$, about 100 sccm of 5% $SiH_4$ in argon, and about 6,000 sccm of argon;
  Pulse duration: $WF_6$ dose for about 0.5 seconds, $WF_6$ purge for about 2.0 seconds, $SiH_4$ dose for about 1.5 seconds, and $SiH_4$ purge for about 1.5 seconds.

The ALD process was continued until the nucleation layer had a thickness of about 25 Å. Thereafter, the substrate was kept in the deposition chamber and exposed to a second soak process under the following conditions:
  Reagent: $SiH_4$;
  Pressure: about 90 Torr;
  Temperature: about 400° C.;
  Flow rates: about 200 sccm of $SiH_4$; and
  Duration: about 24 seconds.

Subsequently, a bulk tungsten layer was deposited $WF_6$—$H_2$ to a thickness of about 500 Å on the second nucleation layer using a CVD process at about 400° C.

While the foregoing is directed to embodiments of the invention, other and further embodiments of the invention may be devised without departing from the basic scope thereof, and the scope thereof is determined by the claims that follow.

The invention claimed is:

1. A method for forming a tungsten-containing material on a substrate, comprising:
  depositing a tungsten silicide layer on a substrate within a processing chamber during a vapor deposition process, comprising:
    exposing the substrate to a silicon precursor gas having a continuous gas flow; and
    exposing the substrate to intermittent pulses of a tungsten precursor gas while flowing the silicon precursor gas and depositing the tungsten silicide layer on the substrate, wherein the substrate is exposed to the silicon precursor gas and the tungsten precursor gas having a silicon/tungsten precursor flow rate ratio of greater than 1;
  depositing a tungsten nitride layer on the tungsten silicide layer;

depositing a tungsten nucleation layer on the tungsten nitride layer; and depositing a tungsten bulk layer on the tungsten nucleation layer.

2. The method of claim 1, wherein the silicon/tungsten precursor flow rate ratio is about 3 or greater.

3. The method of claim 1, wherein the substrate is exposed to each pulse of the tungsten precursor gas for a first time period within a range from about 0.1 seconds to about 2 seconds.

4. The method of claim 3, wherein the substrate is exposed to the silicon precursor gas between the pulses of the tungsten precursor gas for a second time period within a range from about 0.2 seconds to about 5 seconds.

5. The method of claim 4, wherein the first time period is about 0.5 seconds.

6. The method of claim 5, wherein the second time period is about 1 second.

7. The method of claim 1, wherein the silicon precursor gas comprises silane and the tungsten precursor gas comprises tungsten hexafluoride.

8. The method of claim 7, wherein the tungsten bulk layer is deposited by a chemical vapor deposition process.

9. The method of claim 8, wherein the tungsten nucleation layer or the tungsten nitride layer is deposited by an atomic layer deposition process.

10. The method of claim 1, wherein the tungsten suicide layer, the tungsten nitride layer, and the tungsten nucleation layer are each deposited within the same processing chamber.

11. The method of claim 10, wherein the tungsten bulk layer is also deposited within the same processing chamber.

12. A method for forming a tungsten-containing material on a substrate, comprising:

positioning a substrate within a processing chamber;

depositing a tungsten silicide layer on the substrate during a vapor deposition process, comprising:

exposing the substrate to a continuous flow of a silicon precursor gas; and exposing the substrate to intermittent pulses of a tungsten precursor gas while flowing the silicon precursor gas and depositing the tungsten silicide layer, wherein the silicon precursor gas and the tungsten precursor gas are exposed to the substrate having a silicon/tungsten precursor flow rate ratio of about 2 or greater;

depositing a tungsten nitride layer on the tungsten silicide layer; and depositing a tungsten material over the tungsten nitride layer.

13. The method of claim 12, wherein the substrate is exposed to the tungsten precursor gas during each of the pulses lasting a first time period within a range from about 0.1 seconds to about 2 seconds.

14. The method of claim 13, wherein the substrate is exposed to the silicon precursor gas and the substrate is not exposed to the tungsten precursor gas after each of the pulses lasting a second time period within a range from about 0.2 seconds to about 5 seconds.

15. The method of claim 14, wherein the first time period is about 0.5 seconds.

16. The method of claim 12, wherein the second time period is about 1 second.

17. The method of claim 12, wherein the silicon precursor gas comprises silane and the tungsten precursor gas comprises tungsten hexafluoride.

18. The method of claim 17, wherein the silicon precursor gas has a flow rate within a range from about 60 sccm to about 200 sccm.

19. The method of claim 18, wherein the tungsten precursor gas has a flow rate within a range from about 30 sccm to about 150 sccm.

20. The method of claim 12, wherein the substrate is heated to a temperature within a range from about 350° C. to about 400° C. during the vapor deposition process.

21. The method of claim 12, wherein the tungsten silicide layer, the tungsten nitride layer, and the tungsten material are each deposited within the same processing chamber.

22. The method of claim 21, wherein depositing the tungsten material further comprises:

depositing a tungsten nucleation layer on the tungsten nitride layer; and depositing a tungsten bulk layer on the tungsten nucleation layer.

23. The method of claim 12, wherein the tungsten silicide layer has a resistivity measured across the substrate of about $225\Omega\mu$-cm or less.

24. The method as in claim 23, wherein the tungsten silicide layer has a thickness within a range from about 30 Å to about 200 Å.

25. A method for forming a tungsten-containing material on a substrate, comprising:

positioning a substrate within a processing chamber;

depositing a tungsten silicide layer on the substrate during a vapor deposition process, comprising:

exposing the substrate to a continuous flow of a silicon precursor gas;

exposing the substrate to intermittent pulses of a tungsten precursor gas while flowing the silicon precursor gas and depositing the tungsten silicide layer, wherein the silicon precursor gas and the tungsten precursor gas are exposed to the substrate having a silicon/tungsten precursor flow rate ratio of about 2 or greater;

depositing a tungsten nitride layer on the tungsten silicide layer during an atomic layer deposition process;

depositing a tungsten nucleation layer over the tungsten nitride layer during an atomic layer deposition process, wherein the substrate is exposed to a pre-soak gas comprising a reducing agent during a presoak process prior to depositing the tungsten nucleation layer or the substrate is exposed to a post-soak gas comprising the reducing agent during a post-soak process subsequent to depositing the tungsten nucleation layer; and depositing a tungsten bulk layer over the tungsten nucleation layer.

* * * * *

UNITED STATES PATENT AND TRADEMARK OFFICE
CERTIFICATE OF CORRECTION

PATENT NO. : 7,732,327 B2
APPLICATION NO. : 12/239046
DATED : June 8, 2010
INVENTOR(S) : Lee et al.

It is certified that error appears in the above-identified patent and that said Letters Patent is hereby corrected as shown below:

On the Title Page:

Item (57) Abstract, Line 15, please delete "suicide" and insert --silicide-- therefor;

In the Detailed Description:

Column 7, Line 54, please delete "suicide" and insert --silicide-- therefor;

Column 12, Line 39, please delete "suicide" and insert --silicide-- therefor;

In the Examples:

Column 15, Line 7, please delete "suicide" and insert --silicide-- therefor;

In the Claims:

Column 17, Claim 10, Line 27, please delete "suicide" and insert --silicide-- therefor.

Signed and Sealed this

Thirty-first Day of August, 2010

David J. Kappos
*Director of the United States Patent and Trademark Office*